US00RE50984E

(19) United States
(12) Reissued Patent
Hwang et al.

(10) Patent Number: US RE50,984 E
(45) Date of Reissued Patent: *Aug. 4, 2026

(54) ELECTRONIC DEVICE CASE AND MATERIAL LAYER DETAILS OF THE SAME

(71) Applicant: Samsung Electronics Co., Ltd., Suwon-si (KR)

(72) Inventors: Yong Wook Hwang, Yongin-si (KR); Jin Ho Lee, Anyang-si (KR); Young Soo Jang, Yongin-si (KR); Jung Hyeon Hwang, Seoul (KR); Chang Youn Hwang, Hwaseong-si (KR)

(73) Assignee: Samsung Electronics Co., Ltd., Suwon-si (KR)

( * ) Notice: This patent is subject to a terminal disclaimer.

(21) Appl. No.: 18/776,155

(22) Filed: Jul. 17, 2024

Related U.S. Patent Documents

Reissue of:
(64) Patent No.: 10,153,799
Issued: Dec. 11, 2018
Appl. No.: 15/294,646
Filed: Oct. 14, 2016

U.S. Applications:
(63) Continuation of application No. 18/078,003, filed on Dec. 8, 2022, now Pat. No. Re. 50,182, which is an
(Continued)

(30) Foreign Application Priority Data

Oct. 15, 2015 (KR) ..... 10-2015-0144327

(51) Int. Cl.
*H04B 1/3888* (2015.01)
*G06F 1/16* (2006.01)
(Continued)

(52) U.S. Cl.
CPC ..... *H04B 1/3888* (2013.01); *G06F 1/1626* (2013.01); *G06F 1/1656* (2013.01);
(Continued)

(58) Field of Classification Search
CPC .... H04M 1/0274; H04M 1/18; H04M 1/0249; H05K 5/0247; H05K 5/0086; H01Q 1/42;
(Continued)

(56) References Cited

U.S. PATENT DOCUMENTS 7,513,696 B2 4/2009 Wada et al.
7,595,759 B2 9/2009 Schlub et al.
(Continued)

FOREIGN PATENT DOCUMENTS

CA 2707240 A1 9/2010
CN 2775883 4/2006
(Continued)

OTHER PUBLICATIONS

Office Action issued Jul. 30, 2024, in connection with Chinese Patent Application No. 202210652702.2, 16 pages.
(Continued)

*Primary Examiner* — Matthew E Heneghan

(57) ABSTRACT

The disclosure provides a portable terminal including an electronic device and a case disposed thereon that provides water resistant, dust resistant, and insulation for the electronic device by proper positioning of an aperture of the electronic device that uses an area of the case as an antenna. The case includes a body part that comprises a main body with a metallic portion formed of a metallic material, and an auxiliary body disposed adjacent to the metallic portion, and at least a portion of the auxiliary body is used as an antenna for transmission and reception of signals. An insulation member is disposed between the at least a portion of the auxiliary body and the main body, and a bonding layer is disposed in at least one of an area between the insulation member and at least one area of the main body, or between the insulation member and the auxiliary body.

15 Claims, 13 Drawing Sheets

Related U.S. Application Data application for the reissue of Pat. No. 10,153,799, and a continuation of application No. 17/119,907, filed on Dec. 11, 2020, now Pat. No. Re. 49,451, which is an application for the reissue of Pat. No. 10,153,799.

(51) Int. Cl.

| | |
|---|---|
| ***H01Q 1/24*** | (2006.01) |
| ***H01Q 1/42*** | (2006.01) |
| ***H04M 1/02*** | (2006.01) |
| ***H04M 1/18*** | (2006.01) |
| ***H05K 5/00*** | (2025.01) |
| ***H05K 5/02*** | (2006.01) |
| *H04B 1/38* | (2015.01) |

(52) U.S. Cl.
CPC ..... *H01Q 1/243* (2013.01); *H01Q 1/42* (2013.01); *H04M 1/0249* (2013.01); *H04M 1/18* (2013.01); *H05K 5/0017* (2013.01); *H05K 5/0086* (2013.01); *H05K 5/0247* (2013.01); *H04B 2001/3894* (2013.01)

(58) Field of Classification Search
CPC ..... H01Q 1/243; G06F 1/1626; G06F 1/1656; H04B 1/3888; H04B 2001/3894
See application file for complete search history.

(56) References Cited

U.S. PATENT DOCUMENTS 7,717,717 B1 5/2010 Lai
7,808,438 B2 10/2010 Schlub et al.
7,893,883 B2 2/2011 Schlub et al.
7,898,485 B2 3/2011 Schlub et al.
7,989,079 B2 8/2011 Lee et al.
8,094,079 B2 1/2012 Schlub et al.
8,101,230 B2 1/2012 Yumoto
8,243,458 B2 8/2012 Chen et al.
8,575,057 B2 11/2013 Levey et al.
8,747,719 B2 6/2014 Lee et al.
8,885,333 B2 11/2014 Lim et al.
8,932,069 B2 1/2015 Kim et al.
9,024,823 B2 5/2015 Bevelacqua
9,147,932 B2 9/2015 Yarga et al.
9,213,370 B2 12/2015 Yamaguchi et al.
9,225,105 B2 12/2015 Cheong et al.
9,236,659 B2 1/2016 Vazquez et al.
9,270,012 B2 2/2016 Nickel et al.
9,294,600 B2 3/2016 Lasarov et al.
9,326,391 B2 4/2016 Woodhull et al.
9,413,098 B2 8/2016 Chien et al.
9,595,749 B2 3/2017 Yosui et al.
9,601,882 B2 3/2017 Woodhull et al.
9,680,206 B2 6/2017 Youn et al.
9,683,304 B2 6/2017 Kuroyama et al.
9,819,383 B2 11/2017 Youn et al.
9,947,987 B2 4/2018 Yosui et al.
9,985,679 B2 5/2018 Youn et al.
10,122,401 B2 11/2018 Youn et al.
10,461,794 B2 10/2019 Youn et al.
10,567,025 B2 2/2020 Youn et al.
RE50,182 E * 10/2024 Hwang ..... H04M 1/0274
2002/0033778 A1* 3/2002 Yoshinomoto ..... H01Q 1/243 343/895
2002/0131251 A1* 9/2002 Corisis ..... G06K 19/077 361/760
2002/0172017 A1* 11/2002 Tarnowski ..... G06F 1/1622 361/730
2006/0153990 A1 7/2006 Levey et al.
2007/0041686 A1 2/2007 Wada et al.
2008/0057336 A1 3/2008 Kurokawa et al.
2008/0145520 A1 6/2008 Yumoto
2008/0268618 A1* 10/2008 Yamazaki ..... H01L 21/2007
2010/0027184 A1* 2/2010 Chen ..... H05K 9/0067 361/220
2010/0048257 A1* 2/2010 Prest ..... B29C 45/14336 455/575.1
2010/0059877 A1* 3/2010 Leib ..... B81C 1/0023
2010/0101927 A1* 4/2010 Ichikawa ..... H01H 9/52 200/512
2010/0201649 A1* 8/2010 Kai ..... G06F 3/045 345/174
2010/0279108 A1 11/2010 Kuroyama et al.
2010/0284552 A1 11/2010 Lasarov et al.
2011/0003919 A1* 1/2011 Yamanaka ..... C08G 63/06 524/147
2011/0051383 A1 3/2011 Chen et al.
2011/0098090 A1* 4/2011 Parienti ..... H04B 1/3838 455/566
2012/0157175 A1* 6/2012 Golko ..... G06F 1/1698 455/575.7
2012/0175165 A1* 7/2012 Merz ..... G06F 1/1656 174/520
2012/0222963 A1 9/2012 Ishida et al.
2012/0299785 A1* 11/2012 Bevelacqua ..... H01Q 9/42 343/702
2012/0306714 A1 12/2012 Yosui et al.
2013/0027892 A1 1/2013 Lim et al.
2013/0088818 A1 4/2013 Yamaguchi et al.
2013/0143435 A1 6/2013 Kim et al.
2013/0194139 A1* 8/2013 Nickel ..... H01Q 5/328 343/703
2013/0327568 A1* 12/2013 Wang ..... H05K 5/0008 174/565
2014/0011020 A1 1/2014 Mertens et al.
2014/0060917 A1 3/2014 Woodhull et al.
2014/0065411 A1 3/2014 Levey et al.
2014/0100004 A1* 4/2014 Yarga ..... H01Q 1/243 455/575.8
2014/0102908 A1 4/2014 Kuroyama et al.
2014/0139380 A1* 5/2014 Ouyang ..... H01Q 7/00 343/702
2014/0273617 A1 9/2014 Cheong et al.
2015/0244101 A1 8/2015 Chien et al.
2016/0118712 A1 4/2016 Gu et al.
2016/0120046 A1 4/2016 Ou et al.
2016/0151993 A1 6/2016 Ikeda et al.
2016/0192517 A1* 6/2016 Tsao ..... H05K 13/00 361/679.01
2016/0204558 A1 7/2016 Woodhull et al.
2016/0327981 A1* 11/2016 Chiang ..... G06F 1/1626
2016/0344439 A1* 11/2016 Seol ..... H01Q 1/243
2017/0094824 A1* 3/2017 Krogdahl ..... B29B 13/08

FOREIGN PATENT DOCUMENTS

CN 1867848 A 11/2006
CN 200950466 9/2007
CN 101197424 A 6/2008
CN 101578019 A 11/2009
CN 101627537 A 1/2010
CN 101896645 A 11/2010
CN 101922035 A 12/2010
CN 103037039 A 4/2013
CN 103261347 A 8/2013
CN 103378472 A 10/2013
CN 204104250 1/2015
CN 104540340 A 4/2015
CN 104540342 A 4/2015
EP 2528165 A1 11/2012
EP 2579549 A1 4/2013
EP 2602973 A1 6/2013
EP 3021559 A1 5/2016
JP 2006-150353 A 6/2006
JP 2007-221099 8/2007
JP 2007-221099 A 8/2007
JP 2008-246992 10/2008
JP 2008-246992 A 10/2008
JP 2009-144198 A 7/2009
JP 2010-052365 3/2010
JP 2010-052365 A 3/2010

(56) References Cited

FOREIGN PATENT DOCUMENTS

| | | | |
|---|---|---|---|
| JP | 4600701 | B2 | 12/2010 |
| KR | 10-2013-0012521 | | 2/2013 |
| KR | 10-2013-0012521 | A | 2/2013 |
| KR | 20-2013-0005654 | U | 9/2013 |
| KR | 20130005654 | A | 9/2013 |
| KR | 10-2015-0064566 | A | 6/2015 |
| KR | 101571289 | B1 | 11/2015 |
| TW | 201251202 | A | 12/2012 |
| WO | 2009077840 | A2 | 6/2009 |
| WO | 2014035722 | A1 | 3/2014 |
| WO | WO 2015008771 | A1 | 3/2017 |
| WO | WO 2018013573 | A1 | 1/2018 |

OTHER PUBLICATIONS

Office Action dated May 23, 2025, in connection with Chinese Application No. 202210652702.2, 19 pages.
Rejection Decision dated Jul. 28, 2025, in connection with Chinese Application No. 202210652702.2, 21 pages.
International Search Report and Written Opinion dated Jan. 12, 2017, in connection with International Application No. PCT/KR2016/011080, 12 pages.
Extended European Search Report dated Jun. 8, 2018, in connection with European Application No. 16855657.9, 8 pages.
Notification of the First Office Action dated Dec. 26, 2019, in connection with Chinese Application No. 201680059077.3, 13 pages.
European Search Report dated Oct. 23, 2020, in connection with European Application No. 20184510.4, 9 pages.
Summons to attend oral proceedings pursuant to Rule 115(1) EPC dated Jan. 31, 2020, in connection with European Application No. 16855657.9, 8 pages.
Notification of the First Office Action dated Mar. 29, 2021, in connection with Chinese Application No. 202010648180.X, 21 pages.
Notice of Preliminary Rejection dated Nov. 19, 2021, in connection with Korean Application No. 10-2015-0144327, 21 pages.
Notification of the Second Office Action dated Dec. 3, 2021, in connection with Chinese Application No. 202010648180.X, 21 pages.
Notification of the Third Office Action dated Apr. 15, 2022, in connection with Chinese Application No. 202010648180.X, 19 pages.
Niemann, "Machine Elements (vol. one)," Beijing: Machinery Industry Press, Dec. 31, 1985, 7 pages.
Wei, et al., "Theory and practice of Magnesium alloy corrosion protection," Beijing: Metallurgical Industry Press, Apr. 30, 2007, 9 pages.
Office Action dated Aug. 2, 2022, in connection with Chinese Patent Application No. 202010648180.X, 20 pages.
European Search Report dated Mar. 28, 2023, in connection with European Application No. 23150166.9, 9 pages.
Notification of Reexamination dated Jun. 5, 2023, in connection with Chinese Application No. 202010648180.x, 15 pages.
Reexamination Decision dated Nov. 23, 2023, in connection with Chinese Application No. 202010648180.x, 30 pages.
Notification of The First Office Action dated Mar. 13, 2024, in connection with Chinese Patent Application No. 202210652702.2, 21 pages.
Decision of Rejection issued Oct. 25, 2024, in connection with Chinese Patent Application No. 202210652702.2, 18 pages.
Foreign Communication From a Related Counterpart Application, PCT Application No. PCT/KR2016/01180, International Search Report and Written Opinion dated Jan. 12, 2017, 12 pages.
Extended European Search Report regarding Application No. 16855657.9, dated Jun. 8, 2018, 8 page.

* cited by examiner

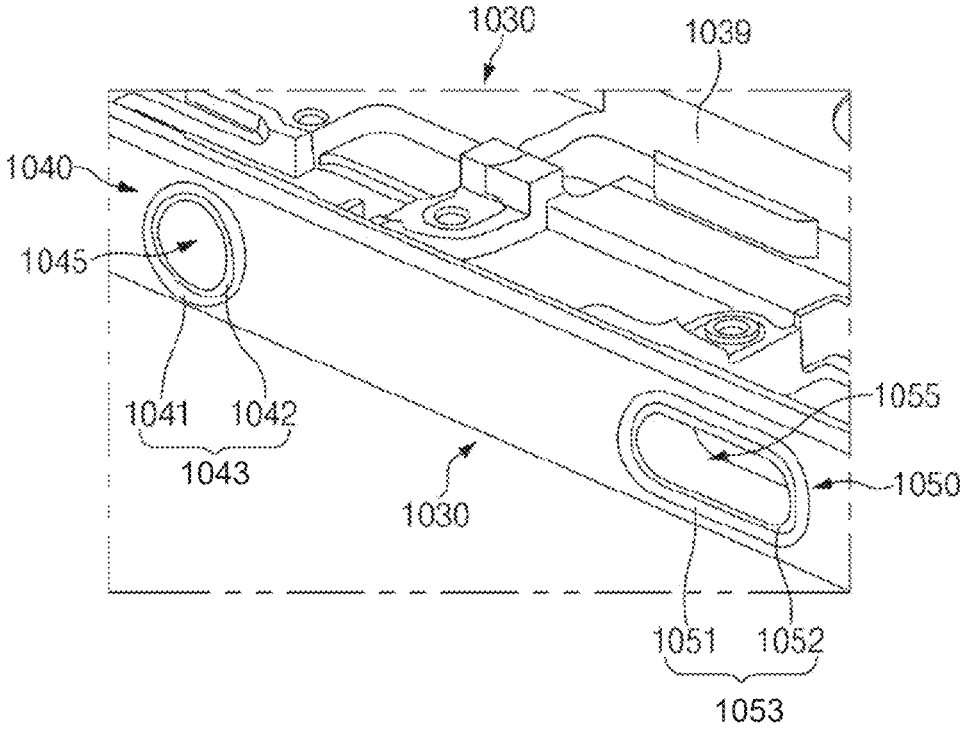
FIG. 10
AMENDED

ELECTRONIC DEVICE CASE AND MATERIAL LAYER DETAILS OF THE SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATION(S) AND CLAIM OF PRIORITY

*Notice: More than one reissue application has been filed for the reissue of U.S. Pat. No. 10,153,799. The reissue applications are the present application and U.S. Reissue patent application Ser. Nos. 17/119,907 and 18/078,003.* The present application is [related to and] *a reissue of U.S. Pat. No. 10,153,799, and is a continuation of U.S. Reissue patent application Ser. No. 18/078,003, which is a continuation of U.S. Reissue patent application Ser. No. 17/119,907, filed Dec. 11, 2020, which are also applications for reissue of U.S. Pat. No. 10,153,799, which* claims [the benefit under 35 U.S.C. § 119(a) of a] *priority to* Korean [patent application] *Patent Application Ser. No. 10-2015-0144327,* filed on Oct. 15, 2015 in the Korean Intellectual Property Office[and assigned Serial number 10-2015-0144327,], the [entire disclosure] *disclosures* of which [is] *are* hereby incorporated by reference.

TECHNICAL FIELD

The present disclosure relates to a case of an electronic device; and more specifically, to a case that includes an area thereof as an antenna, and can provide waterproof, dustproof, and insulation qualities to protect an electronic device.

BACKGROUND

When a metallic case is applied to a portable terminal, such as a smartphone or a tablet, which performs wireless communications, an area of the metallic case may be utilized as an antenna. The area used as the antenna may be electrically separated from the remaining parts.

In the electronic device that uses an area of a case as an antenna according to the related art, dust or moisture may be introduced between the area of the case and the remaining parts.

SUMMARY

To address the above-discussed deficiencies, it is a primary object to provide a case that can provide waterproof, dustproof, and insulation effects by properly arranging an aperture of an electronic device that uses an area of the case as an antenna, and an electronic device including the same.

In accordance with an embodiment of the present disclosure, a portable terminal is provided. The portable terminal may include a front cover that is arranged on a front surface of the portable terminal, a rear part that is arranged on a rear surface of the portable terminal, a side member that is formed (or disposed) integrally with or separately from the rear part while surrounding a space defined by the front cover and the rear part. Additionally, according to an embodiment of the disclosure, the portable device may further include a display device that is arranged in the space and at least a screen area of which is exposed through the front cover. Further, a communication circuit may be provided in the space and the communication circuit may be electrically connected to the side member and a processor, such that the processor is electrically connected to the communication circuit. In an embodiment, the side member of the portable device may include a first elongated metallic member that comprises a first metal and a second elongated metallic member that comprises the first metal. Also, the side member may be electrically separated from the first metallic member while a gap of a specific size is interposed between the first metallic member and the second metallic member. In an embodiment, a first polymer member may fill in the gap and a first organic material layer may be inserted between a first surface of the first polymer member and one surface of the first metallic member. Moreover, in an embodiment, the first organic material may contact the first surface of the first polymer member and the one surface of the first metallic member. Additionally, the first organic material may contact a second organic material layer that is inserted between a second surface of the first polymer member and one surface of the second metallic member; and therefore to face an opposite side of the first surface and contact the second surface of the first polymer member and the one surface of the second metallic member, wherein the first organic material layer and the second organic material layer may include the same material, the one surface of the first metallic member and the one surface of the second metallic member may include recesses of repeated or random patterns, and wherein the first organic material layer and the second organic material layer are formed to conform to the recesses.

In accordance with various embodiments of the present disclosure, an electronic device may include a front cover that defines a front surface of the electronic device, a rear part that defines a rear surface of the electronic device, a side member that is formed integrally with or separately from the rear part while surrounding a space defined by the front cover and the rear part. A display device may be disposed in the space and comprises a screen area exposed through the front cover. A communication circuit may also be disposed in the space and is electrically connected to the side member as well as to a processor. In various embodiments of the disclosure, a side member may include at least one hole area, a polymer member that is arranged on an inner wall of the hall area and a first organic material layer that is inserted between one surface of the polymer member and the inner wall of the hole area. Further, one surface of the hole area may include recesses of repeated or random patterns, and the organic material layer may be formed to conform to the recesses.

In accordance with another embodiment of the present disclosure, a case of an electronic device may include a body part that comprises a main body at least a portion of which is formed of a metallic material, and at least one auxiliary body including a first auxiliary body arranged adjacent to the main body formed of the metallic material. In an embodiment, at least a portion of the first auxiliary body may be used as an antenna and be configured to transmit and receive signals. Additionally, an insulation member may be disposed between the at least a portion of the first auxiliary body and the main body, and a bonding layer may be disposed in one of various places. These various places include at least one of an area between the insulation member and at least one area of the main body, or at least one area between the insulation member and the auxiliary body.

In accordance with another embodiment of the present disclosure, an electronic device may include a body part that comprises a main body at least a portion of which is formed of a metallic material, and at least one auxiliary body arranged adjacent to the main body formed of the metallic material and at least a portion of which is used as an antenna related to transmission and reception of signals, an insulation member that is arranged between the at least a portion of the auxiliary body and the main body, a bonding layer that is arranged at at least one of an area between the insulation member and at least one area of the main body or at least one area between the insulation member and the auxiliary body, a communication circuit electrically connected to the antenna and a printed circuit board on which the communication circuit is mounted.

Other embodiments and salient features of the disclosure will become apparent to those skilled in the art from the following detailed description, which, taken in conjunction with the annexed drawings, discloses various embodiments of the present disclosure.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 8A illustrates a skewed view highlighting the positioning and insertion of a printed circuit board (PCB) into the device with a case and FIG. 8B shows the same device from a viewpoint, straight on, as if the components were 2 dimensional;

FIG. 10 is a view illustrating an area of a case according to an embodiment of the present disclosure;

DETAILED DESCRIPTION

Figure 1E:
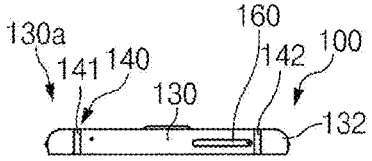
FIGS. 1A to 1F illustrate each of six sides of an electronic device; for example, a left side (as illustrated in FIG. 1A), a front side (as illustrated in FIG. 1B), a right side (as illustrated in FIG. 1C), a back side (as illustrated in FIG. 1D), a top side (as illustrated in FIG. 1E), and a bottom side (as illustrated in FIG. 1F), according to an embodiment of the present disclosure.

FIGS. 1 through 13, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged electronic device and corresponding case for the electronic device.

Various embodiments of the present disclosure may be described with reference to accompanying drawings. Accordingly, those of ordinary skill in the art will recognize that modification, equivalent, and/or alternative on the various embodiments described herein can be variously made without departing from the scope and spirit of the present disclosure. With regard to description of drawings, similar elements may be marked by similar reference numerals.

In the disclosure disclosed herein, the expressions "have", "may have", "include" and "comprise", or "may include" and "may comprise" used herein indicate existence of corresponding features (e.g., elements such as numeric values, functions, operations, or components) but do not exclude presence of additional features.

In the disclosure disclosed herein, the expressions "A or B", "at least one of A or/and B", or "one or more of A or/and B", and the like used herein may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used herein may refer to various elements of various embodiments, but do not limit the elements. Furthermore, such terms may be used to distinguish one element from another element. For example, "a first user device" and "a second user device" may indicate different user devices regardless of the order or priority thereof. For example, "a first user device" and "a second user device" indicate different user devices.

It will be understood that when an element (e.g., a first element) is referred to as being "(operatively or communicatively) coupled with/to" or "connected to" another element (e.g., a second element), it may be directly coupled with/to or connected to the other element or an intervening element (e.g., a third element) may be present. In contrast, when an element (e.g., a first element) is referred to as being "directly coupled with/to" or "directly connected to" another element (e.g., a second element), it should be understood that there are no intervening element (e.g., a third element).

According to the situation, the expression "configured to" used herein may be used as, for example, the expression "suitable for", "having the capacity to", "designed to", "adapted to", "made to", or "capable of". The term "configured to" must not mean only "specifically designed to" in hardware. Instead, the expression "a device configured to" may mean that the device is "capable of" operating together with another device or other components. CPU, for example, a "processor configured to perform A, B, and C" may mean a dedicated processor (e.g., an embedded processor) for performing a corresponding operation or a generic-purpose processor (e.g., a central processing unit (CPU) or an application processor) which may perform corresponding operations by executing one or more software programs which are stored in a memory device.

Terms used in the present disclosure are used to describe specified embodiments and are not intended to limit the scope of the present disclosure. The terms of a singular form may include plural forms unless otherwise specified. Unless otherwise defined herein, all the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal detect unless expressly so defined herein in various embodiments of the present disclosure. In some cases, even if terms are terms which are defined in the specification, they may not be interpreted to exclude embodiments of the present disclosure.

An electronic device according to various embodiments of the present disclosure may include at least one of smartphones, tablet personal computers (PCs), mobile phones, video telephones, e-book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, wearable devices (e.g., head-mounted-devices (HMDs), such as electronic glasses), an electronic apparel, electronic bracelets, electronic necklaces, electronic appcessories, electronic tattoos, smart watches, and the like.

According to another embodiment of the present disclosure, the electronic devices may be home appliances. The home appliances may include at least one of, for example, televisions (TVs), digital versatile disc (DVD) players, audios, refrigerators, air conditioners, cleaners, ovens, microwave ovens, washing machines, air cleaners, set-top boxes, home automation control panels, security control panels, TV boxes (e.g., Samsung HomeSync®, Apple TV®, or Google TV®), game consoles (e.g., Xbox® or PlayStation®), electronic dictionaries, electronic keys, camcorders, electronic picture frames, or the like.

According to another embodiment of the present disclosure, the photographing apparatus may include at least one of medical devices (e.g., various portable medical measurement devices (e.g., a blood glucose monitoring device, a heartbeat measuring device, a blood pressure measuring device, a body temperature measuring device, and the like)), a magnetic resonance angiography (MRA), a magnetic resonance imaging (MRI), a computed tomography (CT), scanners, and ultrasonic devices), navigation devices, global positioning system (GPS) receivers, event data recorders (EDRs), flight data recorders (FDRs), vehicle infotainment devices, electronic equipment for vessels (e.g., navigation systems and gyrocompasses), avionics, security devices, head units for vehicles, industrial or home robots, automatic teller's machines (ATMs), points of sales (POSs), or internet of things (e.g., light bulbs, various sensors, electric or gas meters, sprinkler devices, fire alarms, thermostats, street lamps, toasters, exercise equipment, hot water tanks, heaters, boilers, and the like).

According to another embodiment of the present disclosure, the electronic devices may include at least one of parts of furniture or buildings/structures, electronic boards, electronic signature receiving devices, projectors, or various measuring instruments (e.g., water meters, electricity meters, gas meters, or wave meters, and the like). In the various embodiments of the present disclosure, the electronic device may be one of the above-described various devices or a combination thereof. An electronic device according to an embodiment may be a flexible device. Furthermore, an electronic device according to an embodiment of the present disclosure may not be limited to the above-described electronic devices and may include other electronic devices and new electronic devices according to the development of technologies.

Hereinafter, an electronic device according to the various embodiments of the present disclosure may be described with reference to the accompanying drawings. The term "user" used herein may refer to a person who uses an electronic device or may refer to a device (e.g., an artificial intelligence electronic device) that uses an electronic device.

Figure 1A:
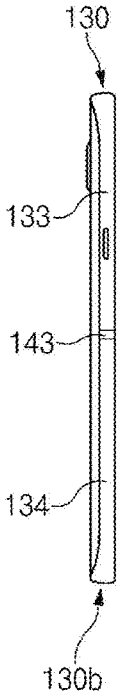
Figure 1B:
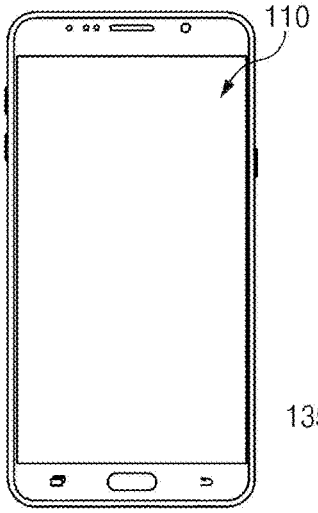

FIGS. 1A to 1F illustrate each of six sides of an electronic device according to various embodiments of the present disclosure. FIG. 1A illustrates a left side of an electronic device, such that a user holding the electronic device and viewing the left side, as shown, would understand a front side of the electronic device is facing to the left, and a rear side of the electronic device is facing to the user's right. When the electronic device is rolled over, 90 degrees to the right, as shown in FIG. 1B, the front side of the electronic device is now facing up.

Figure 1C:
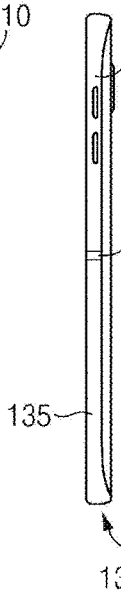
Figure 1D:
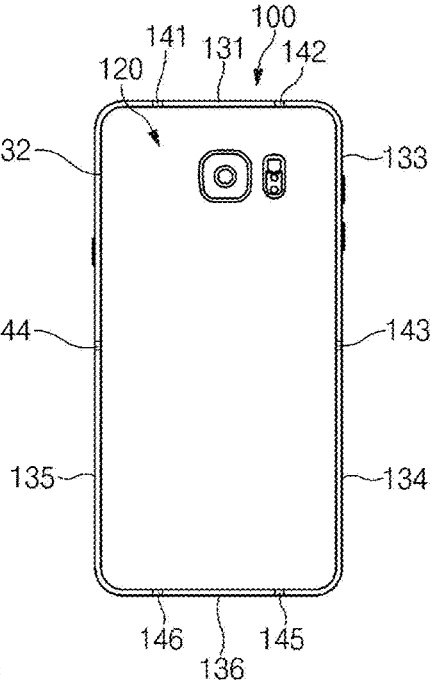
Figure 1F:
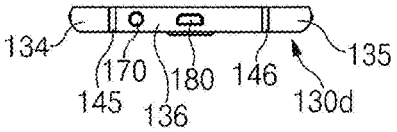

FIG. 1C illustrates a right side of the electronic device, as if the same device of FIGS. 1A and 1B was turned over once more, 90 degrees to the right. Another 90 degree turn in the same direction would make the electronic device appear as in FIG. 1D, with the back side facing up.

If the electronic device was turned on end, viewing a top side of the device such that the elongated sides extend toward and away from a user, the electronic device would be as that illustrated in FIG. 1E.

Finally, flipping the electronic device 180 degrees away from the user, would allow the user to see a bottom side of the electronic device, as illustrated in FIG. 1E.

Referring to FIGS. 1A to 1F, an electronic device will be described using the figures together, since each figure indeed represents the same electronic device, merely turned a different direction or a different amount of degrees, and each of these figures includes the same components, though not all components will be seen in every perspective view of the electronic device. The electronic device 100, for example, may include a front surface 110, a rear surface 120, and a case 130. According to various embodiments of the present disclosure, the electronic device 100 may include a processor related to management of a display arranged on the front surface 110, a memory that stores data related to management of the processor, a communication circuit related to support of a communication function of the electronic device 100, and a printed circuit board on which the processor, the memory, and the communication circuit are mounted.

The front surface 110 may include a front cover and a display unit. A home button and the like may be arranged on the front surface 110.

The rear surface 120 may include a rear cover. A camera may be arranged on the rear surface 120. A battery may be arranged inside the rear surface 120.

For example, at least a portion of the case 130 may be arranged between the front surface 110 and the rear surface 120, and the case 130 may include at least one surface (for example, a side member) that is exposed to the outside between the front surface 110 and the rear surface 120. According to an embodiment, at least a portion of the case 130 may be formed of a metallic material. The entire case 130 may be formed of a metallic material, the entire periphery of the case 130, which is exposed to the outside between the front surface 110 and the rear surface 120, may be formed of a metallic material, or at least a portion of a surface of the case, which is exposed to the outside, may be formed of a metallic material. At least one segmentation part 140 (or an insulation layer (an insulation member and a bonding layer)) may be partially arranged at a periphery of the case 130. Depending on arrangement of the at least one segmentation part 140, the case 130 may include a body part that has a main body and one or more auxiliary bodies 131, 132, 133, 134, 135, and 136. At least some of the main body and the auxiliary bodies 131, 132, 133, 134, 135, and 136 may be formed of a metallic material. The main body and the auxiliary bodies 131, 132, 133, 134, 135, and 136 may be electrically or physically separated by the segmentation part 140. At least a portion of the main body may be covered by the front surface 110.

According to various embodiments of the disclosure, as illustrated, the segmentation part 140 may be arranged on at least one of a first side surface 130a, a second side surface 130b, a third side surface 130c, or a fourth side surface 130d of the case 130. The first side surface 130a (for example, an upper side surface), for example, may include a first auxiliary body 131, a second auxiliary body 132, a third auxiliary body 133, a first segmentation part 141, and a second segmentation part 142. The first auxiliary body 131 and the second auxiliary body 132, for example, may be electrically separated from each other, and the first auxiliary body 131 and the third auxiliary body 133, for example, may be electrically separated from each other through the second segmentation part 142. According to various embodiments, the second auxiliary body 132 and the third auxiliary body 133 may be integrally formed with the main body. In this case, the first auxiliary body 131 may be electrically separated from the main body (for example, the case 130 including the second auxiliary body 132 and the third auxiliary body 133) through the first segmentation part 141 and the second segmentation part 142. According to various embodiments, the first segmentation part 141 and the second segmentation part 142 may be connected to each other between surfaces of the first auxiliary body 131 and the main body, which face each other, to form one structure. Accordingly, the first auxiliary body 131 may be arranged in an island form that is electrically separated from the second auxiliary body 132 and the third auxiliary body 133, which are connected to the main body, between the second auxiliary body 132 and the third auxiliary body 133. The first auxiliary body 131, the second auxiliary body 132, the third auxiliary body 133, the first segmentation part 141, and the second segmentation part 142 may be arranged to have a rounded shape, from which a step is removed for smooth formation of an external appearance thereof.

According to various embodiments, a third segmentation part 143 may be arranged on the second side surface 130b, a fourth segmentation part 144 may be arranged on the third side surface 130c, and a fifth segmentation part 145 and a sixth segmentation part 146 may be arranged on the fourth side surface 130d (for example, a lower side surface). The segmentation parts 141, 142, 143, 144, 145, and 146, for example, may be arranged to electrically separate a first auxiliary body 131, a second auxiliary body 132, a third auxiliary body 133, a fourth auxiliary body 134, a fifth auxiliary body 135, and a sixth auxiliary body 136.

For example, in consideration of the second side surface 130b, the third segmentation part 143 may be arranged to electrically separate the upper third auxiliary body 133 and the lower fourth auxiliary body 134. Further, in consideration of the third side surface 130c, the fourth segmentation part 144 may be arranged to electrically separate the upper second auxiliary body 132 and the lower fifth auxiliary body 135 Further, in consideration of the fourth side surface 130d, the fifth segmentation part 145 may be arranged to electrically separate the fourth auxiliary body 134 and the sixth auxiliary body 136, and the sixth segmentation body 146 may be arranged to electrically separate the fifth auxiliary body 135 and the sixth auxiliary body 136. At least one of the above-mentioned auxiliary bodies 131, 132, 133, 134, 135, and 136 may be electrically connected to the communication circuit of the electronic device 100 to be used as an antenna. In this regard, the electronic device 100 may include a printed circuit board on which the communication circuit is mounted, and a connector (for example, a clip) that electrically connects at least the auxiliary bodies 131, 132, 133, 134, 135, and 136.

A SIM insertion part 160, for example, may be arranged on the first side surface 130a. The SIM insertion part 160, for example, may have a shape that is stepped from the first side surface 130a, and may have a shape of a through-hole that extends inwards. For example, a bonding layer and an insulation member having specific thicknesses may be formed (or disposed) on an inner surface of the SIM insertion part 160 such that the inserted SIM and the SIM insertion part 160 at least a portion of which is formed of a metallic material are electrically insulated from each other. According to various embodiments of the present disclosure, the fourth side surface 130d, for example, may include an ear jack 170 and a USB connector 180. The bonding layer and the insulation member, which have been described above, may be formed around the ear jack 170 and the USB connector 180 to have specific thicknesses.

Meanwhile, various embodiments are not limited to the above-described structure. For example, the electronic device 100 may include segmentation parts, the number of which is larger or smaller than that of the above-mentioned segmentation parts. Accordingly, some of the above-mentioned auxiliary bodies may be electrically connected to the main body and may be integrally formed. Accordingly, it may be understood that the auxiliary body described in various embodiments may include at least one segmentation part to be electrically separated from the main body and at least one segmentation part may be arranged in the electronic device. Hereinafter, an arrangement relationship between an auxiliary body and a main body (or between an auxiliary body and another auxiliary body) will be described with reference to the first auxiliary body 131 and the main body that are arranged on the first surface 130a.

Figure 2:
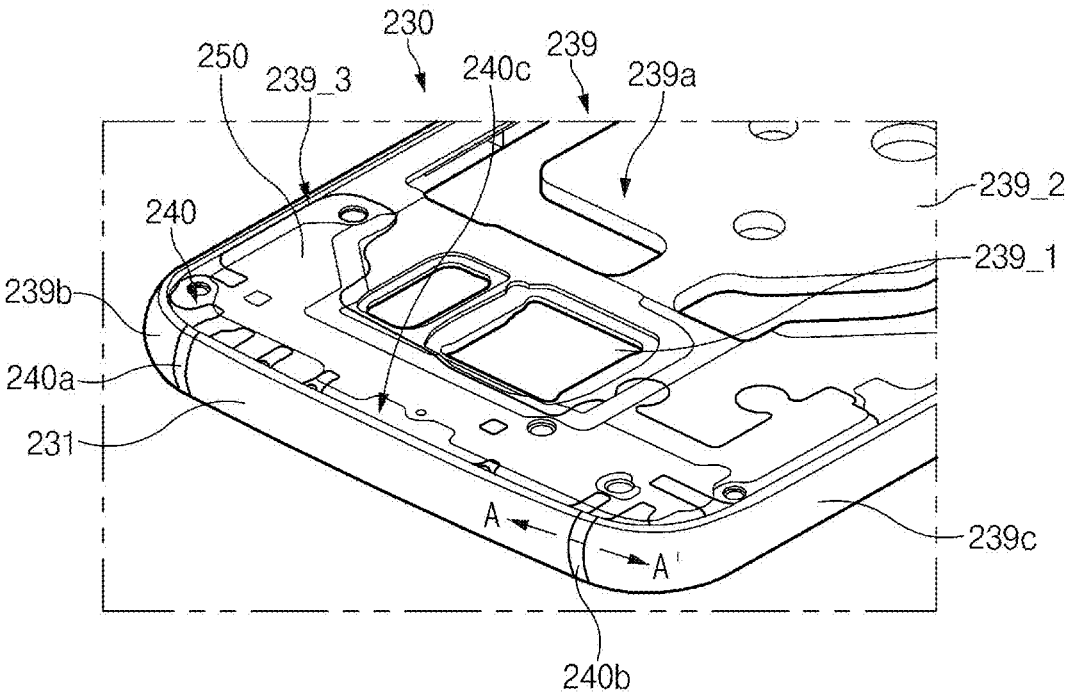
FIG. 2 is a view illustrating a case of an electronic device according to an embodiment of the present disclosure.

FIG. 2 is a view illustrating a case according to an embodiment of the present disclosure.

Referring to FIG. 2, the case 230 (for example, at least a portion of the side member), for example, may be at least one of the above-mentioned side surfaces, or a portion of the at least one side surface. At least one of an SIM connector, the USB connector, or an ear jack may be additionally arranged on one side of the case 230. The case 230 of an embodiment, which will be described below, exemplifies a shape of a portion of the body part that has an auxiliary body 231 (for example, the first auxiliary body 131) and a main body 239. The main body 239, for example, may include a first main body 239b (for example, a form in which the second auxiliary body 132 is connected to a central main body 239a), a second main body 239c (for example, a form in which the third auxiliary body 133 is connected to the central main body 239a), and a central main body 239a.

The central main body 239a, for example, may include a camera hole 239-1 in which a camera is arranged, and a seating part 239-2 in which the front surface 110 of FIG. 1 is arranged. According to an embodiment, side walls 239-3 that extend farther than the inside of the case 230 by a predetermined distance may be arranged at a periphery of the case 230. The side walls 239-3 may be arranged to surround a periphery of the front surface 110 that is seated on the side walls 239-3.

The case 230 may include a bonding insulation layer 240 (for example, the segmentation part 140) that is arranged between the main body 239 and the auxiliary body 231. The bonding insulation layer 240 may include an insulation member and a bonding layer that is arranged at at least a portion of the insulation member. The bonding layer may be arranged on pattern recesses or convexo-concave surfaces that are formed on one surface of the auxiliary body or the main body, together with an insulation member having a fluidity index of a specific value. According to an embodiment, the bonding insulation layer 240 may include a first bonding insulation layer 240a that is arranged between the main body 239b and the auxiliary body 231, and a second bonding insulation layer 240b that is arranged between the second main body 239c and the auxiliary body 231. The case 230 may include a third bonding insulation layer 240c that is arranged between the main body 239a and the auxiliary body 231. For example, an insulation member and a bonding layer may be formed in the third insulation layer 240c, and according to an embodiment, only an insulation member may be included in the third insulation layer 240c while the bonding layer is removed. The first bonding insulation layer 240a, the second bonding insulation layer 240b, and the third insulation layer 240c may be physically connected to each other to function to fix the auxiliary body 231 to the main body 239 while electrically separating the auxiliary body 231 and the main body 239. According to various embodiments, as the first main body 239b, the auxiliary body 231, and the second main body 239c are firmly bonded to each other, the first bonding insulation layer 240a and the second bonding insulation layer 240b may perform a dust-proof, dust minimizing, or dust reducing affect and also a water proof, water minimizing, water reducing, or water resistant function of preventing, minimizing, or reducing an introduction of dust or moisture into the case 230 from the outside.

According to various embodiments of the present disclosure, an insulator applying layer 250 is formed on one side of the central main body 239a of the case 230. The insulator applying layer 250, for example, may perform a function of interrupting electrical connection to the printed circuit board that is seated thereon, or interrupting electrical connection to an antenna that is seated thereon.

Figure 3:
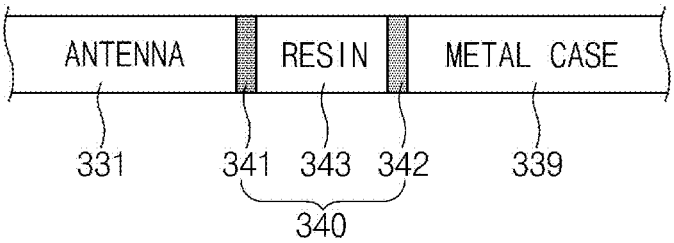
FIG. 3 is a view illustrating a part of a section of a case bonding structure according to an embodiment of the present disclosure.

FIG. 3 is a view illustrating a part of a section of a case bonding structure according to an embodiment of the present disclosure.

Referring to FIG. 3, the case bonding structure (for example, A-A' of FIG. 2) may include an auxiliary body 331 (for example, the auxiliary bodies 131 and 231) that performs a function of an antenna of a communication circuit, a bonding insulation layer 340 (for example, the segmentation part 140 or the bonding insulation layer 240) that is connected and bonded to the auxiliary body 331, and a main body 339 (for example, the main body 239 or the second main body 239c) that is connected to the bonding insulation layer 340.

The bonding insulation layer 340, for example, may include a first bonding layer 341, an insulation member 343, and a second bonding layer 342. The first bonding layer 341, for example, may be arranged between the auxiliary body 331 and the insulation member 343 to firmly bond the auxiliary body 331 and the insulation member 343. The second bonding layer 342 may be arranged between the insulation member 343 and the main body 339 to firmly bond the main body 339 and the insulation member 343. In this regard, one surface of the auxiliary body 331, which faces the first bonding layer 341, or all the surfaces of the auxiliary body 331 may be provided to have recesses of a specific pattern or convexo-concaves. The pattern recesses or convexo-concaves formed on the at least one surface of the auxiliary body 331 may have a specific roughness. In this regard, one surface of the main body 339, which faces the second bonding layer 342, or all the surfaces of the main body 339 may be provided to have recesses of a specific pattern or convexo-concaves. The pattern recesses or convexo-concaves formed on the at least one surface of the main body 339 may have a roughness that is the same as or similar to the roughness of the auxiliary body 331. The roughness, for example, may be Ra 0.1 to 1.5 μm. Further, the roughness may be Rz 0.5 to 5 μm.

The first bonding layer 341 (or the second bonding layer 342), for example, may include an organic bonding layer material. The organic bonding layer material may be triazine thiol, dibutyl amino, dithio pirymidine, or a silane-based composition. According to various embodiments, a thickness of the first bonding layer 341 (or the second bonding layer 342) may be 0.1 to 0.3 m.

The insulation member 343, for example, may include a polymer resin (or a polymer member). The polymer resin may be poly phenylene sulfide (PPS), poly butylene terephthalate (PBT), polyimide (PI), or polycarbonate (PC), and may include inorganic particles (ceramic, glass fibers, or the like) that are suitable for reinforcing mechanical properties. The thickness of the insulation member 343, for example, may be 0.5 to 2.5 mm.

Figure 4:
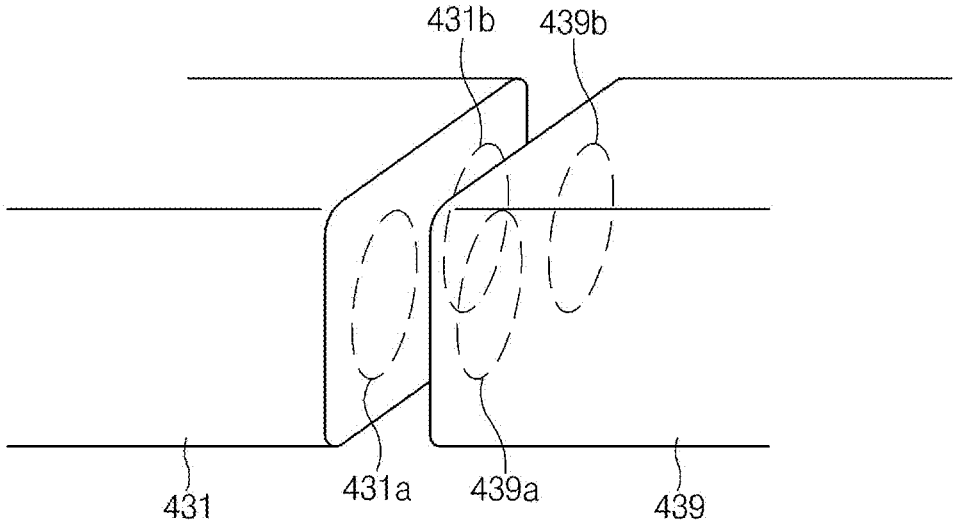
FIG. 4 is a view illustrating a case bonding structure according to an embodiment of the present disclosure.

FIG. 4 is a view illustrating a case bonding structure according to an embodiment of the present disclosure.

Referring to FIG. 4, according to various embodiments, recesses of a specific pattern may be formed in at least an area of a surface of a first auxiliary area 431a of the auxiliary body 431 (for example, the auxiliary bodies 131, 231, and 331). The recesses may have a first roughness. Further, recesses of a specific pattern or convexo-recesses may be formed in at least an area of a surface of a first main area 439a of the main body 439 (for example, the main bodies 239 and 339). The roughness of the recesses or convexo-concaves of the main body 439 may have a second roughness. The roughness described in FIG. 4 may correspond to the first roughness (for example, Ra 0.1 to 1.5 μm, Rz 0.5 to 5 μm) described in FIG. 3. The second roughness may be the same as or similar to the first roughness.

A surface of the second auxiliary area 431b of the auxiliary body 431 may have a third roughness. Further, a surface of the second main area 439b of the main body 439 may have a fourth roughness. The third roughness (or the fourth roughness), for example, may have a relatively rough state value as compared with the first roughness (or the second roughness). For example, the third roughness may have a value of Ra 1.5 μm or more or Rz 5 μm or more. According to various embodiments, when the first roughness (or the second roughness) is Ra 0.1 μm or Rz 0.5 μm, the third roughness (or the fourth roughness) may be a value (for example, Ra 1.5 μm or Rz 5 μm) that exceeds Ra 0.1 μm (or Rz 0.5 μm).

According to an embodiment of the present disclosure, a portable terminal (or portable electronic device) may include a front cover(e.g., at least part of the front surface 110) that is arranged on a front surface of the portable terminal, a rear part (e.g., at least part of the rear surface 120) that is arranged on a rear surface of the portable terminal, a side member(e.g., at least part of the case 130) that is formed integrally with or separately from the rear part while surrounding a space defined by the front cover and the rear part, a display device that is arranged in the space and at least a screen area of which is exposed through the front cover, a communication circuit that is provided in the space and is electrically connected to the side member and a processor electrically connected to the communication circuit, wherein the side member may include a first elongated metallic member (e.g., at least part of the main body) that comprises a first metal, a second elongated metallic member (e.g., at least part of the auxiliary body) that comprises the first metal and is electrically separated from the first metallic member while a gap of a specific size is interposed between the first metallic member and the second metallic member, a first polymer member that is filled in the gap, a first organic material layer (e.g., the first bonding layer 341) that is inserted between a first surface of the first polymer member and one surface of the first metallic member to contact the first surface of the first polymer member and the one surface of the first metallic member and a second organic material layer (e.g., the second bonding layer 342) that is inserted between a second surface of the first polymer member and one surface of the second metallic member to face an opposite side of the first surface and contact the second surface of the first polymer member and the one surface of the second metallic member, wherein the first organic material layer and the second organic material layer may include the same material, the one surface of the first metallic member and the one surface of the second metallic member may include recesses of repeated or random patterns, and wherein the first organic material layer and the second organic material layer are formed to conform to the recesses.

According to various embodiments of the present disclosure, a roughness of the one surface of the first metallic member and a roughness of the one surface of the second metallic member are Ra 0.1 to 1.5 μm.

According to an embodiment of the present disclosure, an electronic device is provided. The electronic device may include a front cover (e.g., glass cover)(e.g., at least part of the front surface 110) that defines a front surface of the electronic device, a rear part that defines a rear surface of the electronic device, a side member (e.g., the case 130) that is formed integrally with or separately from the rear part while surrounding a space defined by the front cover and the rear part, a display device that is provided in the space and comprises a screen area exposed through the front cover, a communication circuit that is provided in the space and is electrically connected to the side member and a processor electrically connected to the communication circuit, wherein the side member may include at least one hole area, a polymer member (e.g., at least part of the segmentation part, at least part of the insulation layer, at least part of an insulation member of the bonding insulation layer 240, or a polymer resin) that is arranged on an inner wall of the hall area and a first organic material layer (e.g., the bonding layer) that is inserted between one surface of the polymer member and the inner wall of the hole area, wherein one surface of the hole area may include recesses of repeated or random patterns, and the organic material layer is formed to conform to the recesses.

According to various embodiments, the hole area may include at least one of an area into which an ear jack is inserted, an area into which a USB is inserted, or an area into which a SIM card is inserted.

Figure 5:
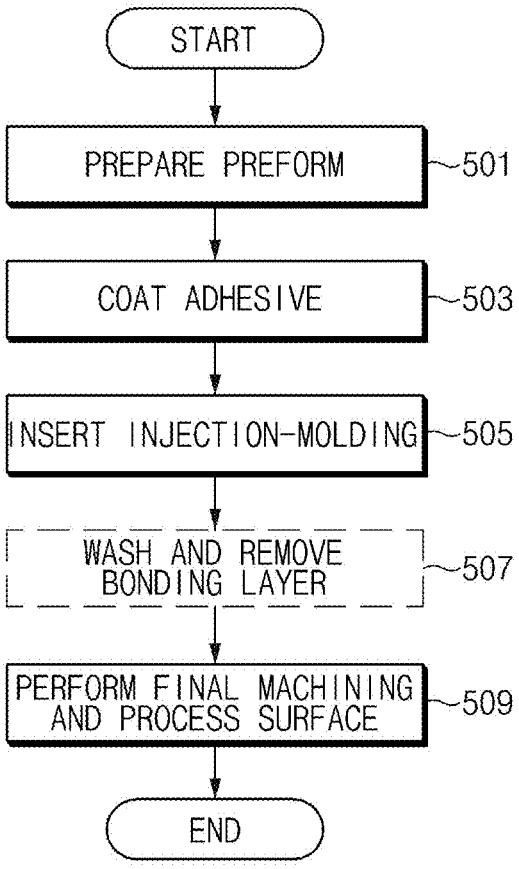
FIG. 5 is a view illustrating a method for manufacturing a case according to an embodiment of the present disclosure.
Figure 6:
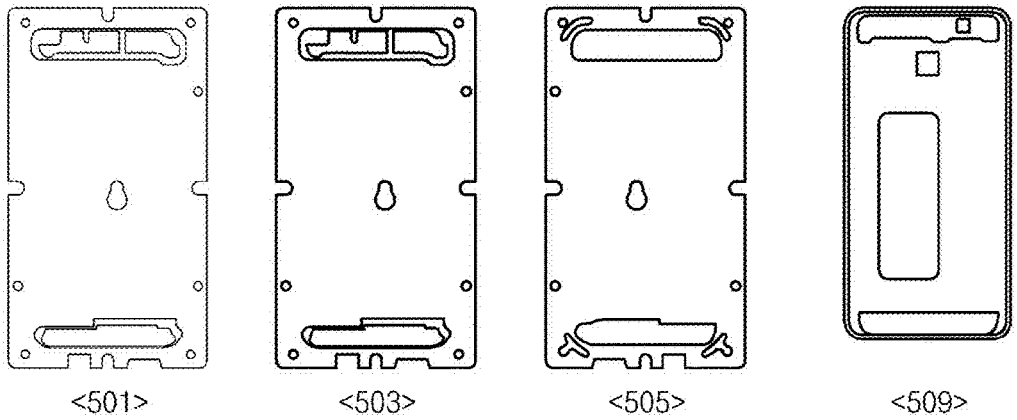
FIG. 6 illustrates a shape of a case as it changes after each operation of a case manufacturing process according to an embodiment of the present disclosure.

FIG. 5 is a flow chart that illustrates a method for manufacturing a case according to an embodiment of the present disclosure. FIG. 6 is a view illustrating a shape of a case in a case manufacturing process according to an embodiment of the present disclosure.

Referring to FIGS. 5 and 6, the method for manufacturing a case, for example, may include a preform preparing operation 501, an adhesive coating operation 503, an insert injection-molding operation 505, a bonding layer washing and removing operation 507, and a final machining and surface-processing operation 509. The bonding layer washing and removing operation 507 may be omitted depending on a condition of the manufacturing process. Further, the bonding layer washing and removing operation may be included in the surface-processing operation 509.

The preform preparing operation 501, for example, may be an operation of preparing a preform that will be utilized as a case of an electronic device 100. In the preform preparing operation 501, a preform, at least a portion of which is metallic, may be provided. The preform preparing operation 501, for example, may include a process of machining a metal that will be used as a case. The metal machining process may be a process of machining a mold into a specific form by inserting a metallic preform into an injection-molding mold of a specific size, and may include a processing operation of forming a space into which an insulation member (for example, the insulation member 343) (for example, a polymer resin) may be inserted. The preform preparing operation 501 may include at least one process of casting, rolling, extrusion, forging, full CNC, pressing, or a combination thereof.

The preform preparing operation 501, for example, may include a machining process of forming an auxiliary body (for example, the auxiliary bodies 131, 231, 331, and 431) (for example, an antenna) and a main body (for example, the main bodies 239, 339, and 439) such that the surface roughness of the auxiliary body and the surface roughness of the main body are Ra (average roughness) 0.001 to 1.5 μm or Rz (maximum roughness) 0.005 to 5 μm. Further, the preform preparing operation 501 may include a machining process of differently forming the roughness of the auxiliary body and the roughness of the main body depending on the locations of the facing surfaces of the auxiliary body and the main body. For example, the preform preparing operation 501 may include a metal machining process of making the roughness of an area that is covered by a front surface (for example, the front surface 110) larger than the roughness of an area exposed to the outside, in the facing surfaces of the auxiliary body and the main body. Through this, various embodiments may improve a support strength by increasing an area in which a bonding layer and an insulation member are arranged in areas (having large Ra and Rz values) having relatively rough surfaces, and may couple the bonding layer and the insulation member to the auxiliary body or the main body firmer to show waterproof, dustproof, and insulation effects in areas (having small Ra or Rz values) having relatively uniform surfaces.

The adhesive coating operation 503 may include a pre-processing process for removing metallic impurities, oil stains, and cutting oil that are stuck to a coating target (for example, the facing surfaces of the auxiliary body and the main body and an area of the main body). The pre-processing process, for example, may include a process of removing impurities on a surface of the coating target by complexly using a surfactant degreasing solution, an alkali degreasing solution, an acid degreasing solution, or the like. According to an embodiment, in the case of aluminum, the pre-processing process may include a surfactant processing process, an alkali processing process, and an acid processing process. The adhesive coating operation 503 may include a process of electro-depositing a material for a bonding layer while an electric current (0.5 to 5 A/dm2) to a surface of the coating target. The material used for the bonding layer, for example, may include an organic bonding material. The organic bonding layer material may be triazine thiol, dibuty amino, dithio pirymidine, or a silane-based composition, and a thickness of the coating layer may be 0.1 to 3 m.

Further, the bonding layer may be attached to various electrified surfaces so that it may be formed even after the coating target is plated or an anodizing layer that is thin enough to be electrified is formed. Accordingly, the adhesive coating operation 503 may include a surface processing process such as plating or anodizing according to a purpose of the coating. Further, the adhesive coating operation 503 may include a process of forming an anodizing layer and a bonding layer at the same time. For example, the adhesive coating operation 503 may include a process of forming an anodizing oxidation layer and a complex substance film of an adhesive at the same time.

The insert injection-molding operation 505 may include a process of inserting a polymer resin into a bonding layer area on which the adhesive is coated. Through this, the insert injection-molding operation 505 may be a process of electrically separating an antenna part (for example, the auxiliary body) and other metallic housing (for example, the main body) from the case. The antenna part may be utilized as an antenna of a specific communication module of an electronic device or an auxiliary antenna of a specific communication module to improve the efficiency of the antenna. During the insert injection-molding operation 505, the temperature of the mold and the temperature of an insert material (for example, the polymer resin) may be maintained at 130 C or more such that the polymer resin (for example, the insulation member) and the bonding layer substance sufficiently react with each other. The thickness of the insulation member layer 343, for example, may be 0.5 to 2.5 mm. The insulation member may be poly phenylene sulfide (PPS), poly butylene terephthalate (PBT), polyimide (PI), or polycarbonate (PC), and may include inorganic particles (ceramic, glass fibers, or the like) that are suitable for reinforcing mechanical properties. According to an embodiment of the present disclosure, the insulation member may be a resin a fluidity index of which is 24 to 30 g/10 min.

The bonding layer washing and removing operation 507 may be applied or omitted according to occasions or a process environment. The bonding layer washing and removing operation 507 may include a process of removing an adhesive layer (or a bonding layer attached to the outside of a metal) that does not react to be left in the adhesive coating operation. In this process, the bonding layer washing and removing operation 507 may include a flushing process of washing the bonding layer with water. The temperature of water in the flushing process may be about 40 to 60° C. The bonding layer washing and removing operation 507 may include a process of removing water left on a surface of a target object after the flushing process by using an air gun or an air shower facility. Further, the bonding layer washing and removing step 507 may include a process of drying moisture to completely remove the moisture. The drying temperature may be about 60 to 100° C. The bonding layer washing and removing operation 507 may be a process of ensuring electrical connection of an electrically connected part of the electronic device and attachment forces of components during surface processing and removing stain errors, and may be selectively managed.

According to various embodiments of the present disclosure, the bonding layer washing and removing operation 507 may include an alkali cleaning process and an acid cleaning process. In the case of an aluminum material, the bonding layer washing and removing operation 507 may be performed during an anodizing pre-processing process.

The final machining and surface-processing operation 509 may be a process that is performed after the process of removing the bonding layer, and may be an operation in which manufacturing of the case is finished. The final processing and surface-processing operation 509, for example, may include a metal machining operation or an injection-molding operation. As illustrated in operation 509 of FIG. 6, only an area that will be used as the case of the electronic device is left through a periphery machining operation and a battery area machining operation.

The aluminum metal member may be an Al—Mg alloy, an Al—Zn—Mg alloy, or an arbitrary aluminum alloy as well as pure aluminum. The above-mentioned polymer resin, for example, may include a thermoplastic resin. The thermoplastic resin may include polyethylene, polypropylene, polyvinyl chloride, polyvinyl acetate, polyacrylate ester, polymetaacrylate ester, unsaturated polyester, polyester, polyamide, polyether, polyurethane elastomer, polystyrene, polyarylsulfone, polyarylate, polyacetal, polyethylene terephthalate, polycarbonate, polyphenylene ether, polyphenylene Bauxite, polyphenylene sulfides, polybutadiene, polybutylene terephthalate, polymetalpanel, and a liquid crystal polymer alloy. Further, the thermoplastic resin may contain a glass filler, a carbon filler, metal whisker, calcium carbonate, a filer or a pigment and a stabilizer.

In addition to the above-mentioned case manufacturing process, various methods of arranging a bonding layer and an insulation member that connect an auxiliary body operated as an antenna of various embodiments of the present disclosure, and a main body may be applied. For example, at least a portion of the case includes an aluminum metal member, and a resin metal combiner that combines a thermoplastic resin member with the aluminum metal member, a membrane of the thermoplastic resin member formed in the aluminum metal member is an anode oxidized film having a thickness of 70 to 1500 nm, the thermoplastic resin member is brought into contact with the aluminum metal member by the anode oxidized film that allows triazine thiol in the interior of and at an upper portion of the thermoplastic resin member, and an infrared ray absorption spectrum peak strength of the anode oxidized film in a specific inspection environment may be 0.0001 to 0.16 nm.

Further, at least a portion of the case may be formed through an anode oxidizing process of taking an aluminum metal member as an anode, using an acid solution of 35 to 90 degrees, performing electrolysis at a current density of not less than 0.02 A/dm2 and less than 2.5 A/dm2, and forming an anode oxidized film having a film thickness of 70 to 1500 nm on the aluminum metal member, a flushing process of washing the aluminum metal member, by which the anode oxidized film is formed, with water of a temperature of not less than 5 degrees and less than 60 degrees, and a process of insert injection-molding a thermoplastic resin in the aluminum metal member in which the anode oxidized film is formed, after the flushing process.

According to various embodiments of the present disclosure, at least a portion of the case may be formed through an anode oxidizing process of taking an aluminum metal member as an anode, using an acid solution of 35 to 90 degrees, performing electrolysis at a current density of not less than 0.02 A/dm2 and less than 2.5 A/dm2, and forming an anode oxidized film having a film thickness of 70 to 1500 nm on the aluminum metal member, an electrolytic polymerizing process of taking the aluminum metal member, by which the anode oxidized film is formed, as an anode, electrolyzing the aluminum metal member in a water solution containing a triazine thiol derivative, and allowing the triazine thiol derivative in the interior of and at an upper portion of the anode oxidized film, a flushing process of washing the aluminum metal member, by which the anode oxidized film is formed, with water of a temperature of not less than 5 degrees and less than 60 degrees, and a process of insert injection-molding a thermoplastic resin in the aluminum metal member in which the anode oxidized film is formed, after the flushing process.

According to various embodiments of the present disclosure, at least a portion of the case may be formed through a process of taking an aluminum metal member as an anode, electrolyzing the aluminum metal member in an acid solution of 35 to 90 degrees containing a triazine thiol derivative at a current density of not less than 0.02 A/dm2 and less than 2.5 A/dm2, and forming an anode oxidized film having a film thickness of 70 to 1500 nm and having a thiol derivative in the interior of and at an upper portion thereof, on the aluminum metal member, a flushing process of washing the aluminum metal member in which the anode oxidized film containing the triazine thiol is formed, with water of not less than 5 degrees and less than 60 degrees and a process of insert injection-molding a thermoplastic resin in the aluminum metal member in which the anode oxidized film is formed, after the flushing process.

According to various embodiments of the present disclosure, at least a portion of the case may be formed through an anode oxidizing process of taking an aluminum metal member as an anode, using an acid solution of 35 to 90 degrees, performing electrolysis at a current density of not less than 0.02 A/dm2 and less than 2.5 A/dm2, and forming an anode oxidized film having a film thickness of 70 to 1500 nm on the aluminum metal member, an immersion process of immersing the aluminum metal member in which the anode oxidized film is formed in a solution containing a triazine thiol derivative to generate a triazine thiol derivative in the interior of and at an upper portion of the anode oxidized film, a flushing process of washing the aluminum metal member, by which the anode oxidized film is formed, with water of a temperature of not less than 5 degrees and less than 60 degrees, and a process of insert injection-molding a thermoplastic resin in the aluminum metal member in which the anode oxidized film is formed, after the flushing process.

According to various embodiments, the electronic device, for example, may include a metallic antenna (for example, the auxiliary body) in which at least a portion of the case is used as an antenna, a contact part of the metallic antenna, a contact part that is grounded to the metallic antenna, and PCBs. Here, the case of the electronic device according to various embodiments may include a metallic antenna, a metallic housing (for example, the main body) except for the metallic antenna, a polymer resin (for example, the insulation member) that connects the metallic antenna and the metallic housing, and a bonding layer (or an organic bonding layer) that fills the gaps between the metallic antenna and the metallic housing, and the polymer resin and maintains bonding force.

According to various embodiments of the present disclosure, a bonding insulation layer that performs at least one of a waterproof or water resistant function, a dustproof or dust resistant function, or an insulation function may be formed between the metal housing and the metal antenna that is a part of the metal housing used as an antenna. For example, various embodiments may provide a waterproof or water resistant affect by preventing, minimizing, or reducing an amount of water from penetrating into a gap between an external antenna part (for example, the auxiliary body) and the injection-molded joint part (for example, the bonding insulation layer) when the metallic case is applied to a wireless terminal (for example, the electronic device). The case of the electronic device according to various embodiments of the present disclosure may include a polymer resin material that connects the metallic antenna part and the metallic housing, and an organic adhesive layer that fills a gap between the polymer resin and the metallic antenna part or a gap between the polymer resin and the metallic housing and maintains a joining state thereof.

Figure 7A:
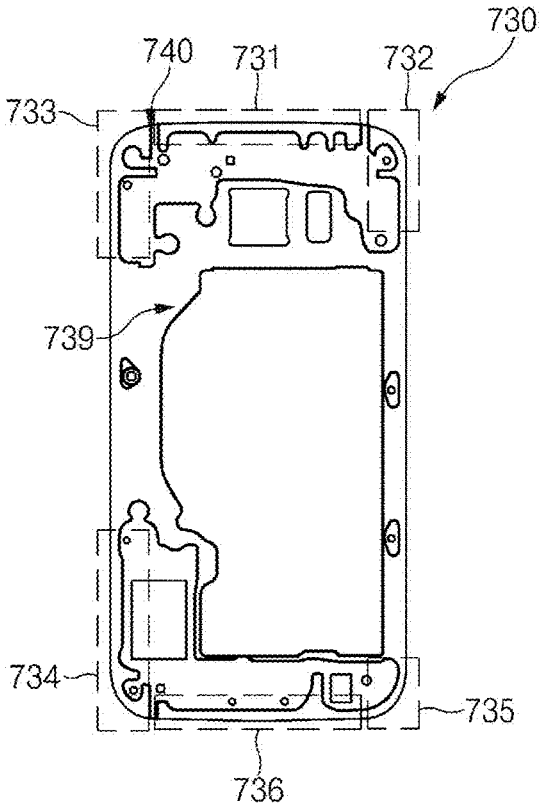
FIGS. 7A and 7B illustrate a left side and a right side, respectively, of a shape of a case surrounding an electronic device that is disposed between a front cover and a rear side of the case, according to an embodiment of the present disclosure.
Figure 7B:
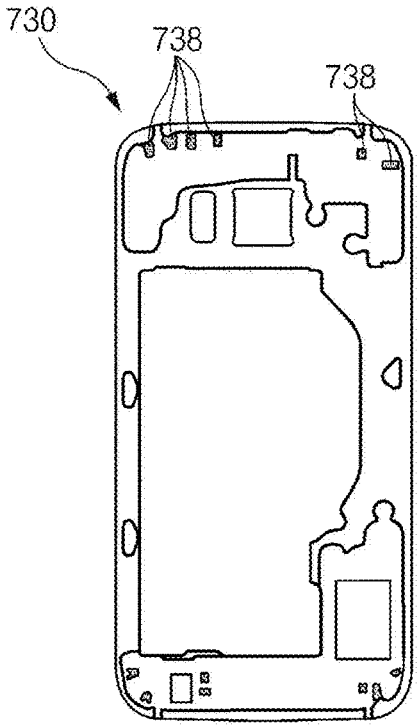

FIGS. 7A and 7B illustrate a left side and a right side, respectively, of a shape of a case surrounding an electronic device that is disposed between a front cover and a rear side of the case according to an embodiment of the present disclosure.

Referring to FIGS. 7A and 7B, the case 730 may include a body part that has one or more auxiliary bodies 731, 732, 733, 734, 735, and 736 that are electrically separated from the main body 739 by one or more segmentation parts 740 (for example, the segmentation part 140 and the bonding insulation layers 240 and 340). For example, as described above with reference to FIG. 1 and the like, the auxiliary bodies 731, 732, 733, 734, 735, and 736 may include at least one of a first auxiliary body 731 that is arranged a lateral side of an upper end of the body part, second auxiliary bodies 732 that are arranged on the left and right sides of the first auxiliary body 731, a third auxiliary body 733, a fourth auxiliary body 734 that is arranged on the left side of a lower end of the body part, a fifth auxiliary body 735 that is arranged on the right side of the lower end of the body part, and a sixth auxiliary body 736 that is arranged between the fourth auxiliary body 734 and the fifth auxiliary body 735. Further, at least one of the above-mentioned auxiliary bodies 731, 732, 733, 734, 735, and 736 may be designed to be electrically or physically connected to the main body 739 according to the design purpose thereof.

Contact parts 738 may be arranged in at least an area of the main body 739. The contact parts 738 relate to antenna performance, and may be arranged at at least a portion of the main body 739. The locations and number of the contact parts 738 may vary depending on the number of the communication modules applied to the electronic device and frequency band characteristics of the communication modules.

Figure 8A:
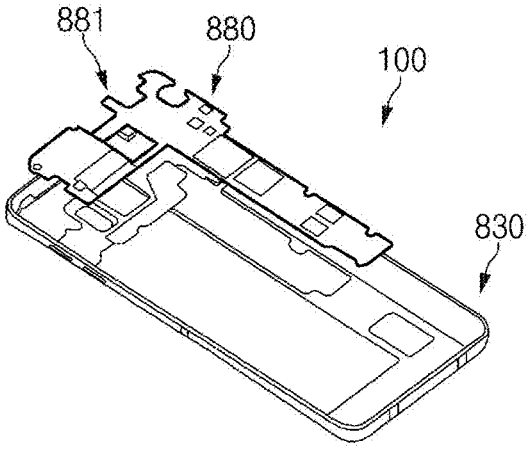
FIGS. 8A and 8B illustrate a configuration of an electronic device according to an embodiment of the present disclosure.
Figure 8B:
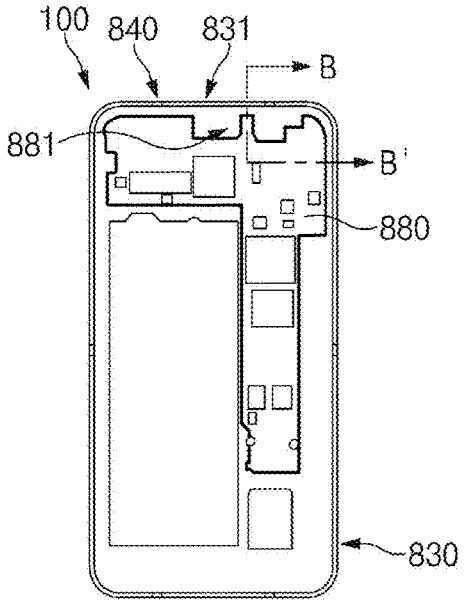

FIGS. 8A and 8B illustrate a configuration of an electronic device according to an embodiment of the present disclosure. In particular, FIG. 8A illustrates a skewed view of the configuration, allowing a 3-dimensional perspective, highlighting the positioning of the components therein and allowing the viewer to understand where and how insertion of a printed circuit board (PCB) into the device with the case may be according to various embodiments of the present disclosure. FIG. 8B illustrates the same device shown in FIG. 8A from a viewpoint looking straight on, such that no depth is illustrated. Indeed, the illustration of FIG. 8B appears as if the components of the device were all 2-dimensional.

Referring to FIG. 8, the electronic device 100, for example, may include a case 830 and a printed circuit board 880. The printed circuit board (PCB) 880, for example, may include at least one communication circuit that is operated based on at least one frequency band, a processor, and a memory. According to various embodiments of the present disclosure, the printed circuit board 880 may include a contact part 881. As illustrated, the printed circuit board 880 may be arranged on a front part (for example, the front part 110) (or the rear part 120) of the case 830. Further, if necessary, the case may be fixed to one side of the front part. For example, at least a portion of the printed circuit board 880 may be arranged to be electrically separated from the case 830. Further, at least a portion of the printed circuit board 880 may be arranged to be electrically connected to the case 830. According to an embodiment of the present disclosure, the contact part 881 arranged in the printed circuit board 880 may be electrically connected to the case 830. Through this, the printed circuit board 880 may utilize at least a portion of the case 830 as a ground area. According to various embodiments, for example, the contact part 881 of the printed circuit board 880 may be connected to a communication circuit, and the contact part 881 may be electrically connected to at least one auxiliary body 831. The case 830 may include one or more auxiliary bodies that are partitioned by at least one segmentation part 840.

Figure 9:
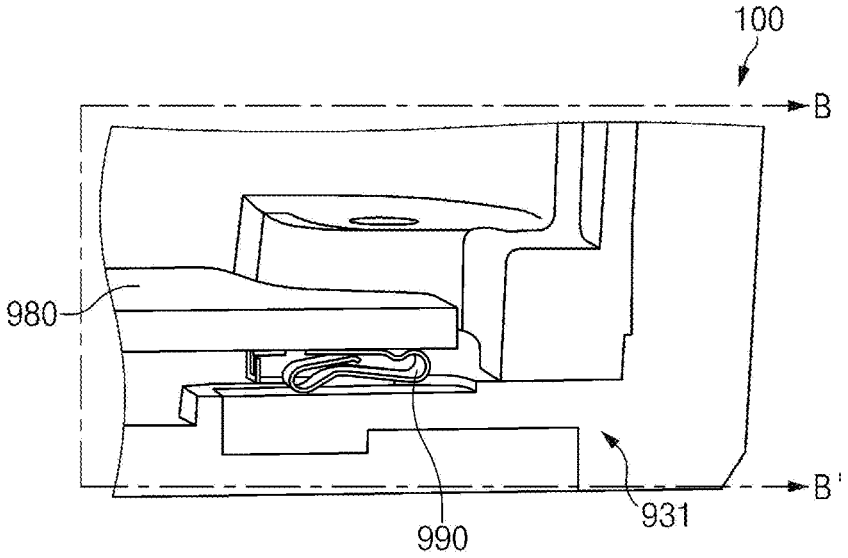
FIG. 9 is a view illustrating a section of a configuration of an electronic device, for example, the section B-B' of FIG. 8B, according to an embodiment of the present disclosure.

FIG. 9 is a view exemplarily illustrating a section B-B' as indicated in FIG. 8B, this section being a part of a configuration of an electronic device according to an embodiment of the present disclosure.

Referring to FIG. 9, the electronic device 100 may include a case 930, a printed circuit board 980, and a contact part 990. According to an embodiment, the contact part 990 may electrically or physically connect an area (for example, the contact part 881) of the printed circuit board 980 and one side of the case 930. For example, as illustrated, the contact part 990 may have a clip shape. In the drawing, the contact part 990 may be electrically connected to the auxiliary bodies 931 (for example, the auxiliary bodies 131, 231, 331, 431, 731, and 831) of the case 930. The auxiliary body 931, for example, may be at least one of the one or more auxiliary bodies described with reference to FIGS. 1 and 7. The auxiliary body 931, for example, may be electrically connected to a communication circuit of the printed circuit board 980 to perform a function of an antenna of the communication circuit. According to various embodiments, the auxiliary body 931 may perform a function of a ground area of the communication circuit.

FIG. 10 is a view illustrating an area of a case on an electronic device, according to an embodiment of the present disclosure.

Referring to FIG. 10, an area of the case 1030 of the electronic device may include an auxiliary body 1031 (for example, the auxiliary bodies 131 and 231), the main body 1039 (for example, the main bodies 239 and 339), an ear jack area 1040, and an USB area 1050. The auxiliary body 1031, for example, may be at least one side of the case 1030. Although the drawing exemplifies that the ear jack area 1040 and the USB area 1050 are arranged in the auxiliary body 1031 on the same side, various embodiments are not limited thereto. For example, the ear jack area 1040 and the USB area 1050 may be arranged in an auxiliary body on another side through change of a design.

The ear jack area 1040, for example, may include a first hole area 1045 that passes through the auxiliary body 1031, and a first insulation layer 1043 (for example, a configuration corresponding to the bonding insulation layer 240) that is arranged on an inner wall of the first hole area 1045 to have a specific thickness. The first insulation layer 1043 may be bonded to an inner wall of the first hole area 1045 and have a specific thickness, and a through-hole may be formed at a central portion of the first insulation layer 1043. A diameter of the through-hole, for example, may be the same as or similar to a diameter of a connector of an inserted ear jack. The first insulation layer 1043, for example, may include a first bonding layer 1041 (a configuration corresponding to the bonding layer 341) and a first insulation member 1042 (for example, a configuration corresponding to the insulation member 343). The first bonding layer 1041 may correspond to the above-mentioned organic bonding layer. The first insulation member 1042 may be formed of the above-mentioned polymer resin. An inner wall of the first hole area 1045, for example, may have the above-mentioned first roughness. Further, a roughness of an area of the outside (for example, a side close to the auxiliary body 1031 from the center of the main body 1039) of the inner wall of the first hole area 1045 may be smaller (smoother) than a roughness of an area (for example, a side close to the center of the main body 1039 from the auxiliary body 1031) of the inside of the inner wall of the first hole area 1045.

The USB area 1050, for example, may include a second hole area 1055 that passes through one side of a side part of the auxiliary body 1031 and a length along one axis of which is longer than a length along another axis thereof, and a second insulation layer 1053 that is arranged on an inner wall of the second hole area 1055 to have a specific thickness. At least a portion of the second insulation layer 1053 may be bonded to the inner wall of the second hole area 1055 and have a specific thickness, and a through-hole having a specific length may be formed at a central portion of the second insulation layer 1053. A diameter of the through-hole, for example, may be the same as or similar to a diameter of an inserted USB connector. The second insulation layer 1053, for example, may include a second bonding layer 1051 (a configuration corresponding to the bonding layer 341 or 342) and a second insulation member 1052 (for example, a configuration corresponding to the insulation member 343). The second bonding layer 1051 may correspond to the above-mentioned organic bonding layer. The second insulation member 1052 may be formed of the above-mentioned polymer resin. An inner wall of the second hole area 1055, for example, may have the above-mentioned first roughness. Further, a roughness of an area of the inside (for example, a side close to the main body 1039 from the auxiliary body 1031) of the inner wall of the second hole area 1055 may be larger than a roughness of an area (for example, a side close to the auxiliary body 1031 from the main body 1039) of the outside of the inner wall of the second hole area 1055 The first insulation layer 1043 and the second insulation layer 1053, which have been described above, may have the same thickness from the inner wall of the hole area. Based on the first insulation layer 1043 and the second insulation layer 1053, which have been described above, the electronic device may prevent, minimize, or reduce a likelihood or intensity of an electric shock, improve a resistance to an external pressure, and reduce a damage to the electronic device.

Figure 11:
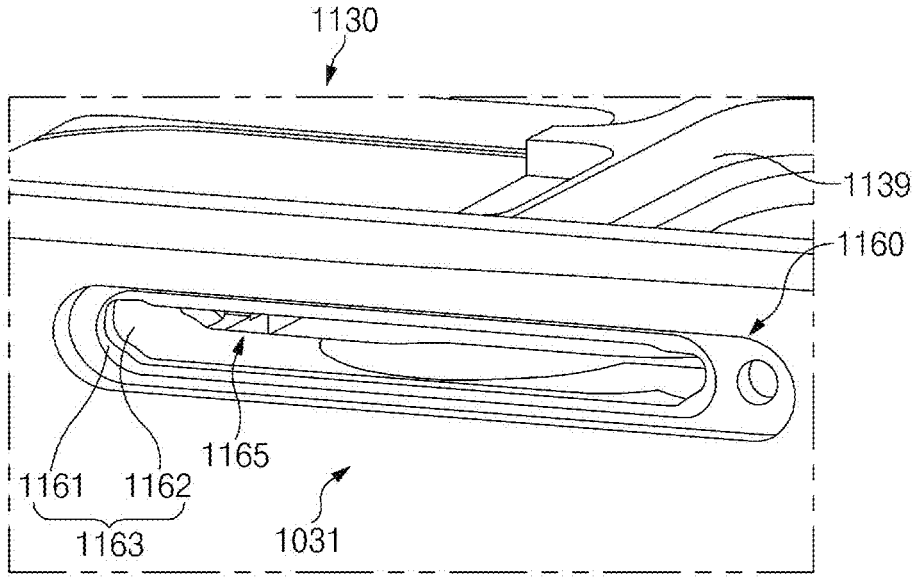
FIG. 11 is a view illustrating an area of a case according to an embodiment of the present disclosure.

FIG. 11 is a view illustrating another area of a case according to an embodiment of the present disclosure.

Referring to FIG. 11, an area of the case 1130 of the electronic device may include an auxiliary body 1131 (for example, the auxiliary bodies 131 and 231), the main body 1139 (for example, the main bodies 239 and 339), and a SIM area 1160. The auxiliary body 1131, for example, may be at least one side of the case 1130. Although the drawing exemplifies that only the SIM area 1160 is arranged on the auxiliary body 1131, various embodiments are not limited thereto. For example, at least one of the ear jack area 1040 and the USB area 1050, which have been described in FIG. 10, as well as the SIM area 1160 may be arranged in the auxiliary body 1131 according to a change of design or the like.

The SIM area 1160, for example, may include a third hole area 1165 that passes through the auxiliary body 1131, and a third insulation layer 1163 that is arranged on an inner wall of the third hole area 1165 to have a specific thickness. According to various embodiments, as illustrated, the third hole area 1165 may have a stepped shape. A cover that covers an opened part of the SIM area 1160 after the SIM card is inserted, for example, may be arranged in the stepped area.

The third insulation layer 1163 may be bonded to an inner wall of the third hole area 1165 and have a specific thickness, and a through-hole may be formed at a central portion of the third insulation layer 1163. A diameter of the through-hole, for example, may be the same as or similar to a thickness of the inserted SIM card. The third insulation layer 1163, for example, may include a third bonding layer 1161 (a configuration corresponding to the bonding layer 331 or 332) and a third insulation member 1162 (for example, a configuration corresponding to the insulation member 343). The third bonding layer 1161 may correspond to the above-mentioned organic bonding layer. The third insulation member 1162 may be formed of the above-mentioned polymer resin. An inner wall of the third hole area 1165, for example, may have the above-mentioned first roughness. Further, a roughness of an area of the outside (for example, a side close to the auxiliary body 1139 from the center of the main body 1165) of the inner wall of the third hole area 1139 may be smaller (smoother) than a roughness of an area (for example, a side close to the center of the main body 1131 from the auxiliary body 1131) of the inner wall of the third hole area 1165.

Through the third insulation layer 1163 that is firmly arranged on an inner wall of the third hole area 1165 of the above-mentioned SIM area 1160, the electronic device may prevent, minimize, or reduce a size of an aperture being generated between the third insulation layer 1163 and the inner wall of the third hole area 1165. Thus, the electronic device may further perform a waterproof or water resistant function and a dustproof or dust resistant function, while also preventing, minimizing, or reducing an electric shock, and firmly supporting the third insulation layer 1163 in the third hole area 1165.

According to various embodiments of the present disclosure, a case of an electronic device is provided. The case may include a body part that comprises a main body at least a portion of which is formed of a metallic material, and at least one auxiliary body arranged adjacent to the main body formed of the metallic material and at least a portion of which is used as an antenna related to transmission and reception of signals, an insulation member that is arranged between the at least a portion of the auxiliary body and the main body and a bonding layer that is arranged at at least one of an area between the insulation member and at least one area of the main body or at least one area between the insulation member and the auxiliary body.

According to various embodiments of the present disclosure, a roughness of a surface of the main body, which faces the insulation member, or a surface of the auxiliary body, which faces the insulation member, is Rz 0.01 to 3 μm or Ra 0.01 to 1.5 μm.

According to various embodiments of the present disclosure, a roughness of a periphery of a surface of the main body, which faces the insulation member, is different from a roughness of a central portion of the surface of the main body.

According to various embodiments of the present disclosure, the roughness of the periphery of the surface of the main body is smaller than the roughness of the central portion of the surface of the main body.

According to various embodiments of the present disclosure, a roughness of a periphery of a surface of the auxiliary body, which faces the insulation member, is different from a roughness of a central portion of the surface of the auxiliary body.

According to various embodiments of the present disclosure, the roughness of the periphery of the surface of the auxiliary body is smaller than the roughness of the central portion of the surface of the auxiliary body.

According to various embodiments of the present disclosure, the insulation member comprises a polymer resin comprising at least one of poly phenylene sulfide (PPS), poly butylene terephthalate (PBT), polyimide (PI), or polycarbonate (PC).

According to various embodiments of the present disclosure, the insulation member is formed of a polymer resin containing inorganic particles.

According to various embodiments of the present disclosure, the insulation member has a thickness of 0.5 to 2.5 mm.

According to various embodiments of the present disclosure, the bonding layer comprises an organic bonding layer formed of at least one of triazine thiol, dibutyl amino, dithio pirymidine, or a silane-based composition.

According to various embodiments of the present disclosure, the bonding layer has a thickness of 0.1 to 3 m.

According to various embodiments of the present disclosure, the bonding layer is arranged in an area of a side periphery of the main body.

According to various embodiments of the present disclosure, the bonding layer is arranged in a transverse end area of the auxiliary body that is longer transversely than longitudinally.

According to various embodiments of the present disclosure, the bonding layer is arranged in all parts of surfaces of the main body and the auxiliary body, which face each other.

According to various embodiments of the present disclosure, an electronic device may include a body part that comprises a main body at least a portion of which is formed of a metallic material, and at least one auxiliary body arranged adjacent to the main body formed of the metallic material and at least a portion of which is used as an antenna related to transmission and reception of signals, an insulation member that is arranged between the at least a portion of the auxiliary body and the main body, a bonding layer that is arranged at at least one of an area between the insulation member and at least one area of the main body or at least one area between the insulation member and the auxiliary body, a communication circuit electrically connected to the antenna and a printed circuit board on which the communication circuit is mounted.

According to various embodiments of the present disclosure, the electronic device may further include a front part that is arranged on a front surface of the main body and a rear part that is arranged on a rear surface of the main body, wherein the auxiliary body is arranged such that at least a portion of the auxiliary body is exposed to the outside between the front part and the rear part, and wherein the bonding layer is arranged between the exposed area of the auxiliary body and the insulation member or between an exposed area of the main body and the insulation member.

According to various embodiments of the present disclosure, there is provided a metallic case of an electronic device having an segmentation structure, the metallic case including a main body at least a portion of which is metallic, an antenna part that is partitioned from the main body, at least a portion of which is metallic, and at least a portion of which is exposed to the outside, an insulation member that is arranged in a gap formed between the main body and the antenna part due to the partitioning, and a bonding layer that is arranged at one site between the insulation member and the main body and between the antenna part and the insulation member.

According to various embodiments of the present disclosure, a case of an electronic device may include a main body that has a recess at at least a portion thereof and at least a portion of which is metallic, an auxiliary body that is physically spaced apart by a distance from the recess of the main body and at least a portion of which is metallic, an insulation member that is arranged between the main body and the auxiliary body to fix the auxiliary body to the main body while electrically separating the main body and the auxiliary body, and a bonding layer that is arranged at one site between the insulation member and the main body and between the auxiliary body and the insulation member.

Figure 12:
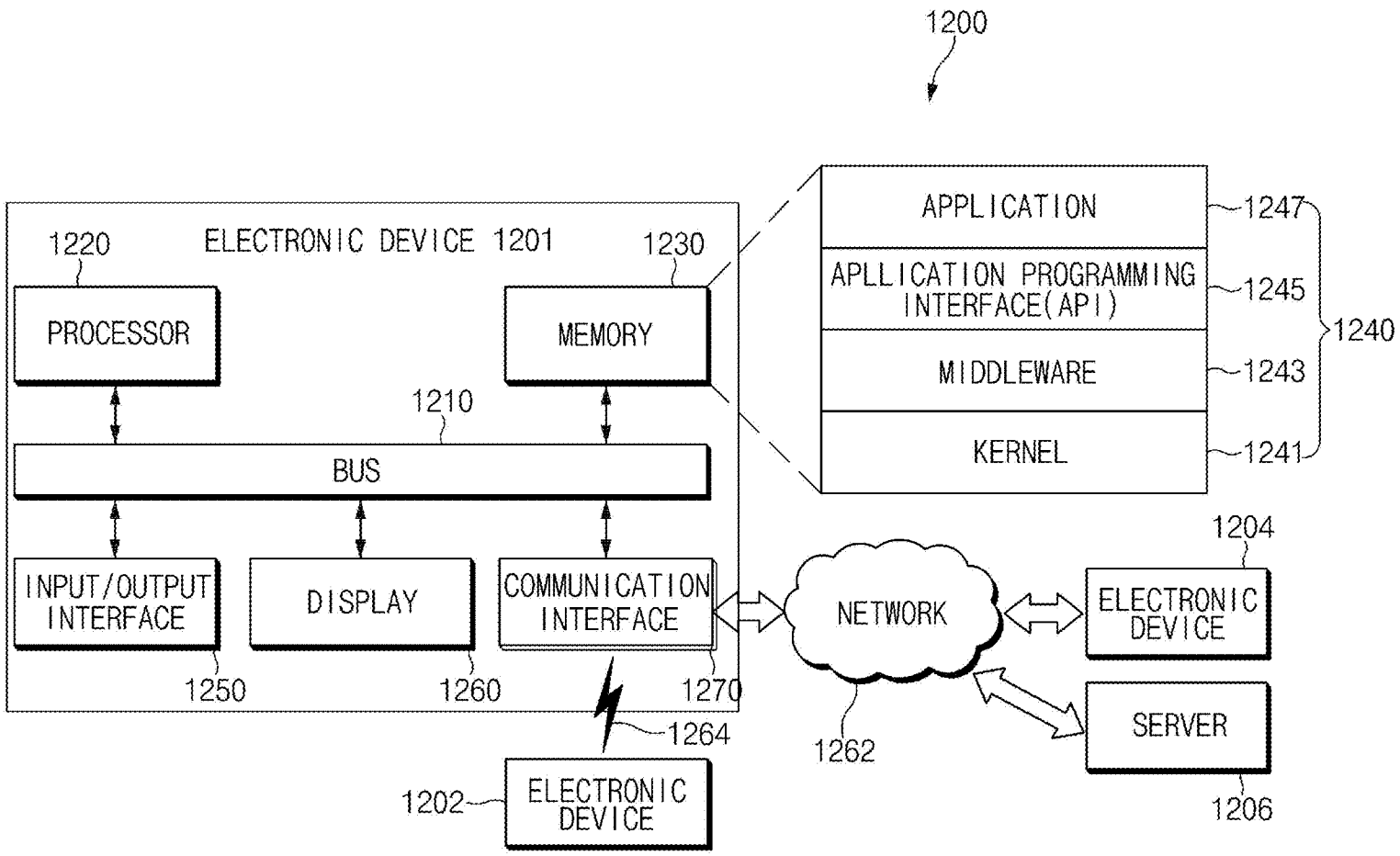
FIG. 12 is a view illustrating an electronic device management environment according to an embodiment of the present disclosure.

FIG. 12 is a view illustrating an electronic device management environment according to an embodiment of the present disclosure.

Referring to FIG. 12, the electronic device management environment 1200 according to an embodiment of the present disclosure may include an electronic device 1201, a first external electronic device 1202, a second external electronic device 1204, a server 1206, and a network 1262.

The network 1262 may allow formation of a communication channel between the electronic device 1201 and the first external electronic device 1202, or between the second external electronic device 1204 or the electronic device 1201 and the server 1206. The network 1262 allows contents stored in the electronic device 1201 to be transmitted to the first external electronic device 1202, the second external electronic device 1204, or the server 1206. The server 1206 may form a communication channel with the electronic device 1201 through the network 1262. The server 1206 may receive contents from the electronic device 1201 and store the received contents. Further, the server 1206 may provide a feedback for the reception of the contents to the electronic device 1201.

The above-mentioned electronic device 1201 may include a bus 1210, a processor 1220, a memory 1230, an input/output interface 1250, a display 1260, and a communication interface 1270. Further, the electronic device 1201 may include an antenna 2076 that is connected to the communication interface 1270. In addition, the electronic device 1201 may further include an antenna assistant device that is arranged between the communication interface 1270 and the processor 1220. In some embodiments, the electronic device 1201 may exclude at least one of the elements or may additionally include another element. Further, the electronic device 1201 may include a housing (or the case) that surrounds or receives at least some of the configurations.

The bus 1210 may be, for example, a circuit which connects the components 1220 to 1270 with each other and transmits a communication signal (e.g., a control message and/or data) between the components.

The processor 1220 may include one or more of a central processing unit (CPU), an application processor (AP), or a communication processor (CP). For example, the processor 1220 may perform calculation or data processing about control and/or communication of at least another of the components of the electronic device 1201. The processor 1220 may control a variable value of a variable inductor, which has been described above. For example, when the antenna performance is a reference value or less, the processor 1220 may change the physical characteristics of the antenna assistant device by adjusting an inductance value of the variable inductor. Through this, the process 1220 may improve frequency characteristics by adjusting sub-resonance characteristics.

The memory 1230 may include a volatile and/or non-volatile memory. The memory 1230 may store, for example, a command or data associated with at least another of the components of the electronic device 1201. According to an embodiment, the memory 1230 may store software and/or a program 1240. The program 1240 may include, for example, a kernel 1241, a middleware 1243, an application programming interface (API) 1245, and/or an least one application program 1247 (or "at least one application"), and the like. At least part of the kernel 1241, the middleware 1243, or the API 1245 may be referred to as an operating system (OS).

The kernel 1241 may control or manage, for example, system resources (e.g., the bus 1210, the processor 1220, or the memory 1230, and the like) used to execute an operation or function implemented in the other programs (e.g., the middleware 1243, the API 1245, or the application program 1247). Also, as the middleware 1243, the API 1245, or the application program 1247 accesses a separate component of the electronic device 1201, the kernel 1241 may provide an interface which may control or manage system resources.

The middleware 1243 may play a role as, for example, a go-between such that the API 1245 or the application program 1247 communicates with the kernel 1241 to communicate data.

Also, the middleware 1243 may process one or more work requests, received from the application program 1247, in order of priority. For example, the middleware 1243 may assign priority which may use system resources (the bus 1210, the processor 1220, or the memory 1230, and the like)

of the electronic device 1201 to at least one of the at least one application program 1247. For example, the middleware 1243 may perform scheduling or load balancing for the one or more work requests by processing the one or more work requests in order of the priority assigned to the at least one of the at least one application program 1247.

The API 1245 may be, for example, an interface in which the application program 1247 controls a function provided from the kernel 1241 or the middleware 1243. For example, the API 1245 may include at least one interface or function (e.g., a command) for file control, window control, image processing, or text control, and the like.

The input and output interface 1250 may play a role as, for example, an interface which may transmit a command or data input from a user or another external device to another component (or other components) of the electronic device 1201. Also, input and output interface 1250 may output an instruction or data received from another component (or other components) of the electronic device 1201 to the user or the other external device.

The display 1260 may include, for example, a liquid crystal display (LCD), a light emitting diode (LED) display, an organic LED (OLED) display, a microelectromechanical systems (MEMS) display, or an electronic paper display. The display 1260 may display, for example, a variety of content (e.g., text, images, videos, icons, or symbols, and the like) to the user. The display 1260 may include a touch screen, and may receive, for example, touch, gesture, proximity, or a hovering input using an electronic pen or part of a body of the user.

The communication interface 1270 may establish communication between, for example, the electronic device 1201 and an external device (e.g., a first external electronic device 1202, a second external electronic device 1204, or a server 1206). For example, the communication interface 1270 may connect to a network 1262 through wireless communication or wired communication and may communicate with the external device (e.g., the second external electronic device 1204 or the server 1206).

The wireless communication may use, for example, at least one of long term evolution (LTE), LTE-advanced (LTE-A), code division multiple access (CDMA), wideband CDMA (WCDMA), universal mobile telecommunications system (UMTS), wireless broadband (WiBro), or global system for mobile communications (GSM), and the like as a cellular communication protocol. Also, the wireless communication may include, for example, local-area communication 1264. The local-area communication 1264 may include, for example, at least one of wireless-fidelity (Wi-Fi) communication, Bluetooth® (BT) communication, near field communication (NFC), or global navigation satellite system (GNSS) communication, and the like.

An MST module may generate a pulse based on transmission data using an electromagnetic signal and may generate a magnetic field signal based on the pulse. The electronic device 1201 may output the magnetic field signal to a point of sales (POS) system. The POS system may restore the data by detecting the magnetic field signal using an MST reader and converting the detected magnetic field signal into an electric signal.

The GNSS may include, for example, at least one of a global positioning system (GPS), a Glonass®, a Beidou® navigation satellite system (hereinafter referred to as "Beidou"), or a Galileo® (i.e., the European global satellite-based navigation system) according to an available area or a bandwidth, and the like. Hereinafter, the "GPS" used herein may be interchangeably with the "GNSS". The wired communication may include at least one of, for example, universal serial bus (USB) communication, high definition multimedia interface (HDMI) communication, recommended standard 232 (RS-232) communication, or plain old telephone service (POTS) communication, and the like. The network 1262 may include a telecommunications network, for example, at least one of a computer network (e.g., a local area network (LAN) or a wide area network (WAN)), the Internet, or a telephone network. The communication interface 1270 may use the auxiliary body described with reference to FIG. 1 or the like as a part of an antenna or the entire antenna.

Each of the first and second external electronic devices 1202 and 1204 may be the same as or different device from the electronic device 1201. According to an embodiment, the server 1206 may include a group of one or more servers. According to various embodiments, all or some of operations executed in the electronic device 1201 may be executed in another electronic device or a plurality of electronic devices (e.g., the first external electronic device 1202, the second external electronic device 1204, or the server 1206). According to an embodiment of the present disclosure, if the electronic device 1201 should perform any function or service automatically or according to a request, it may request another device (e.g., the first external electronic device 1202, the second external electronic device 1204, or the server 106) to perform at least part of the function or service, rather than executing the function or service for itself or in addition to the function or service. The other electronic device (e.g., the first external electronic device 1202, the second external electronic device 1204, or the server 1206) may execute the requested function or the added function and may transmit the executed result to the electronic device 1201. The electronic device 1201 may process the received result without change or additionally and may provide the requested function or service. For this purpose, for example, cloud computing technologies, distributed computing technologies, or client-server computing technologies may be used.

Figure 13:
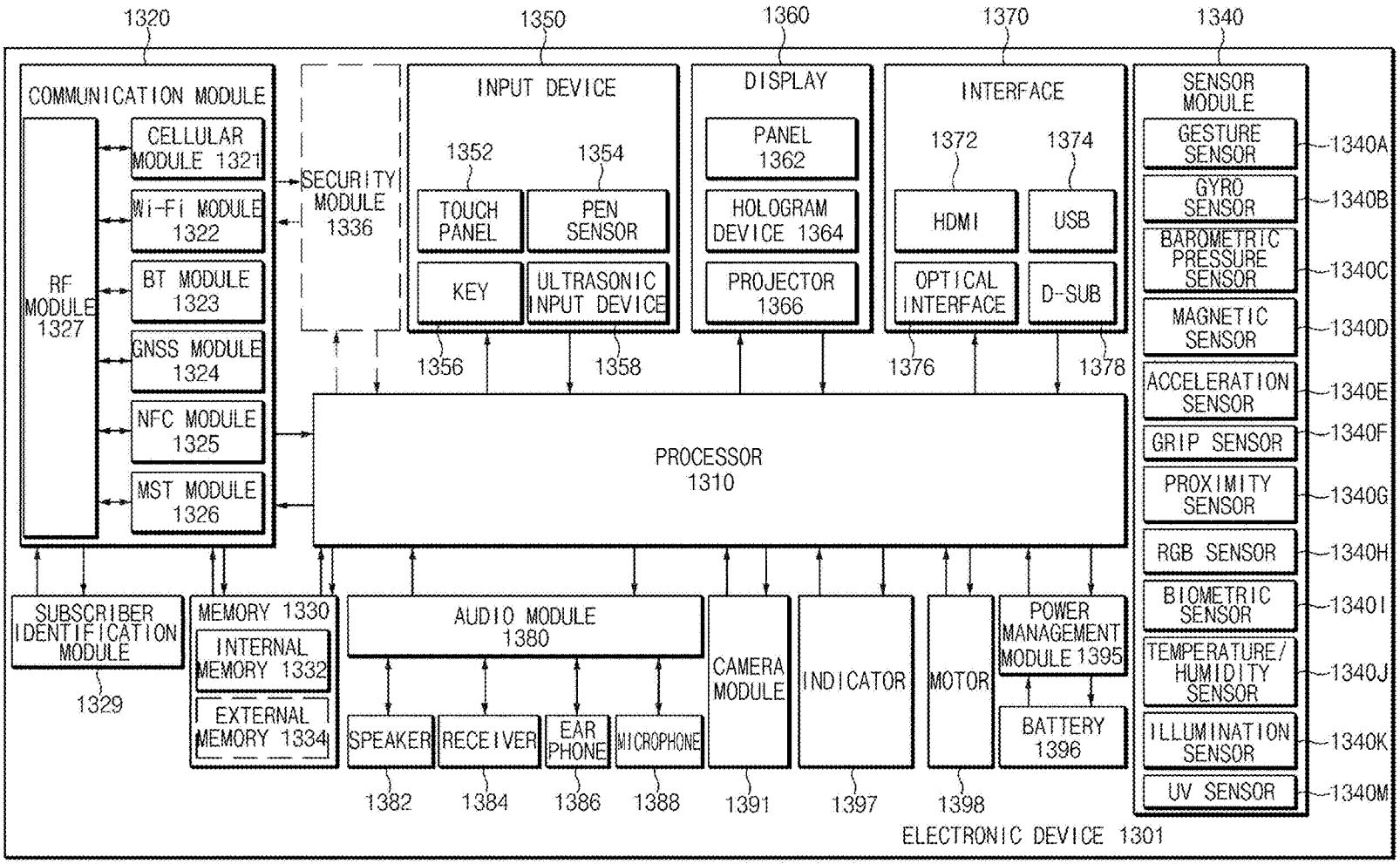
FIG. 13 is a block diagram of an electronic device according to various embodiments of the present disclosure.

FIG. 13 is a block diagram of an electronic device according to various embodiments of the present disclosure.

An electronic device 1301 may include, for example, the entirety or a part of the electronic device 100 and 1201 of FIG. 1 or FIG. 12. Referring to FIG. 13, the electronic device 1301 may include at least one processor (for example, an application processor (AP) 1310), a communication module 1320, a subscriber identification module card 1329, a memory 1330, a sensor module 1340, an input device 1350, a display 1360, an interface 1370, an audio module 1380, a camera module 1391, a power management module 1395, a battery 1396, an indicator 1397, or a motor 1398.

The processor 1310 may drive, for example, an operating system (OS) or an application program to control a plurality of hardware or software components connected thereto and may process and compute a variety of data. The processor 1310 may be implemented with, for example, a system on chip (SoC). According to an embodiment, the processor 1310 may include a graphic processing unit (GPU) (not shown) and/or an image signal processor (not shown). The processor 1310 may include at least some (e.g., a cellular module 1321) of the components shown in FIG. 13. The processor 1310 may load a command or data received from at least one of other components (e.g., a non-volatile memory) into a volatile memory to process the data and may store various data in a non-volatile memory. The processor 1310 may process transmission and reception of signals by using the auxiliary body described with reference to FIG. 1 and the like as an antenna or the entire antenna of the communication module 1320.

The communication module 1320 may have the same or similar configuration to a communication interface 1370 of FIG. 12. The communication module 1320 may include, for example, the cellular module 1321, a wireless-fidelity (Wi-Fi) module 1322, a Bluetooth® (BT) module 1323, a global navigation satellite system (GNSS) module 1324 (e.g., a GPS module, a Glonass® module, a Beidou® module, or a Galileo® module), a near field communication (NFC) module 1325, an MST module 1326, and a radio frequency (RF) module 1327. An antenna assistant device may be connected to at least one of the above-mentioned communication module 1320. A capacitance of a capacitor module, an inductance of an inductor module, and the like of the connected antenna assistant device may correspond to a frequency band managed by the corresponding communication module or may be adjusted. The communication module 1320 may be electrically connected to at least one auxiliary body and may transmit and receive signals by using the auxiliary body.

The cellular module 1321 may provide, for example, a voice call service, a video call service, a text message service, or an Internet service, and the like through a communication network. According to an embodiment of the present disclosure, the cellular module 1321 may identify and authenticate the electronic device 1301 in a communication network using the SIM 1329 (e.g., a SIM card). According to an embodiment, the cellular module 1321 may perform at least part of functions which may be provided by the processor 1310. According to an embodiment of the present disclosure, the cellular module 1321 may include a communication processor (CP).

The Wi-Fi module 1322, the BT module 1323, the GNSS module 1324, the NFC module 1325, or the MST module 1326 may include, for example, a processor for processing data transmitted and received through the corresponding module. According to various embodiments, at least some (e.g., two or more) of the cellular module 1321, the Wi-Fi module 1322, the BT module 1323, the GNSS module 1324, the NFC module 1325, or the MST module 1326 may be included in one integrated chip (IC) or one IC package.

The RF module 1327 may transmit and receive, for example, a communication signal (e.g., an RF signal). Though not shown, the RF module 1327 may include, for example, a transceiver, a power amplifier module (PAM), a frequency filter, or a low noise amplifier (LNA), or an antenna, and the like. According to another embodiment, at least one of the cellular module 1321, the Wi-Fi module 1322, the BT module 1323, the GNSS module 1324, the NFC module 1325, or the MST module 1326 may transmit and receive an RF signal through a separate RF module.

The SIM 1329 may include, for example, a card which includes a SIM and/or an embedded SIM. The SIM 1329 may include unique identification information (e.g., an integrated circuit card identifier (ICCID)) or subscriber information (e.g., an international mobile subscriber identity (IMSI)).

The memory 1330 (e.g., a memory 1230 of FIG. 12) may include, for example, an embedded memory 1332 or an external memory 1334. The embedded memory 1332 may include at least one of, for example, a volatile memory (e.g., a dynamic random access memory (DRAM), a static RAM (SRAM), a synchronous dynamic RAM (SDRAM), and the like), or a non-volatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a flash memory (e.g., a NAND flash memory or a NOR flash memory, and the like), a hard drive, or a solid state drive (SSD)).

The external memory 1334 may include a flash drive, for example, a compact flash (CF), a secure digital (SD), a micro-SD, a mini-SD, an extreme digital (xD), a multimedia car (MMC), or a memory stick, and the like. The external memory 1334 may operatively and/or physically connect with the electronic device 1301 through various interfaces.

The secure module 1336 may be a module which has a relatively higher secure level than the memory 1330 and may be a circuit which stores secure data and guarantees a protected execution environment. The secure module 1336 may be implemented with a separate circuit and may include a separate processor. The secure module 1336 may include, for example, an embedded secure element (eSE) which is present in a removable smart chip or a removable SD card or is embedded in a fixed chip of the electronic device 1301. Also, the secure module 1336 may be driven by an OS different from the OS of the electronic device 1301. For example, the secure module 1336 may operate based on a java card open platform (JCOP) OS.

The sensor module 1340 may measure, for example, a physical quantity or may detect an operation state of the electronic device 1301, and may convert the measured or detected information to an electric signal. The sensor module 1340 may include at least one of, for example, a gesture sensor 1340A, a gyro sensor 1340B, a biometric pressure sensor 1340C, a magnetic sensor 1340D, an acceleration sensor 1340E, a grip sensor 1340F, a proximity sensor 1340G, a color sensor 1340H (e.g., red, green, blue (RGB) sensor), a biometric sensor 1340I, a temperature/humidity sensor 1340J, an illumination sensor 1340K, or an ultraviolet (UV) sensor 1340M. Additionally or alternatively, the sensor module 1340 may further include, for example, an e-nose sensor (not shown), an electromyography (EMG) sensor (not shown), an electroencephalogram (EEG) sensor (not shown), an electrocardiogram (ECG) sensor (not shown), an infrared (IR) sensor (not shown), an iris sensor (not shown), and/or a fingerprint sensor (not shown), and the like. The sensor module 1340 may further include a control circuit for controlling at least one or more sensors included therein. According to various embodiments of the present disclosure, the electronic device 1301 may further include a processor configured to control the sensor module 1340, as part of the processor 1310 or to be independent of the processor 1310. While the processor 1310 is in a sleep state, the electronic device 1301 may control the sensor module 1340. In some embodiments, the electronic device 1301 may further include a processor configured to control the sensor module 1340 as a part of or separately from the processor 1310, and may control the sensor module 1340 while the processor 1310 is in a sleep state.

The input device 1350 may include, for example, a touch panel 1352, a (digital) pen sensor 1354, a key 1356, or an ultrasonic input unit 1358. The touch panel 1352 may use at least one of, for example, a capacitive type, a resistive type, an infrared type, or an ultrasonic type. Also, the touch panel 1352 may further include a control circuit. The touch panel 1352 may further include a tactile layer and may provide a tactile reaction to a user.

The (digital) pen sensor 1354 may be, for example, part of the touch panel 1352 or may include a separate sheet for recognition. The key 1356 may include, for example, a physical button, an optical key, or a keypad. The ultrasonic input unit 1358 may allow the electronic device 1301 to detect a sound wave using a microphone (e.g., a microphone 1388) and to verify data through an input tool generating an ultrasonic signal.

The display 1360 (e.g., a display 1260 of FIG. 12) may include a panel 1362, a hologram device 1364, or a projector 1366. The panel 1362 may include the same or similar configuration to the display 160 or 1260. The panel 1362 may be implemented to be, for example, flexible, transparent, or wearable. The panel 1362 and the touch panel 1352 may be integrated into one module. The hologram device 1364 may show a stereoscopic image in a space using interference of light. The projector 1366 may project light onto a screen to display an image. The screen may be positioned, for example, inside or outside the electronic device 1301. According to an embodiment, the display 1360 may further include a control circuit for controlling the panel 1362, the hologram device 1364, or the projector 1366.

The interface 1370 may include, for example, a high-definition multimedia interface (HDMI) 1372, a universal serial bus (USB) 1374, an optical interface 1376, or a D-subminiature 1378. The interface 1370 may be included in, for example, a communication interface 170 or 1270 shown in FIG. 2 or 12. Additionally or alternatively, the interface 1370 may include, for example, a mobile high definition link (MHL) interface, an SD card/multimedia card (MMC) interface, or an infrared data association (IrDA) standard interface.

The audio module 1380 may convert a sound and an electric signal in dual directions. At least part of components of the audio module 1380 may be included in, for example, an input and output interface 1250 (or a user interface) shown in FIG. 12. The audio module 1380 may process sound information input or output through, for example, a speaker 1382, a receiver 1384, an earphone 1386, or the microphone 1388, and the like.

The camera module 1391 may be a device which captures a still image and a moving image. According to an embodiment of the present disclosure, the camera module 1391 may include one or more image sensors (not shown) (e.g., a front sensor or a rear sensor), a lens (not shown), an image signal processor (ISP) (not shown), or a flash (not shown) (e.g., an LED or a xenon lamp).

The power management module 1395 may manage, for example, power of the electronic device 1301. According to an embodiment of the present disclosure, though not shown, the power management module 1395 may include a power management integrated circuit (PMIC), a charger IC or a battery or fuel gauge. The PMIC may have a wired charging method and/or a wireless charging method. The wireless charging method may include, for example, a magnetic resonance method, a magnetic induction method, or an electromagnetic method, and the like. An additional circuit for wireless charging, for example, a coil loop, a resonance circuit, or a rectifier, and the like may be further provided. The battery gauge may measure, for example, the remaining capacity of the battery 1396 and voltage, current, or temperature thereof while the battery 1396 is charged. The battery 1396 may include, for example, a rechargeable battery or a solar battery.

The indicator 1397 may display a specific state of the electronic device 1301 or part (e.g., the processor 1310) thereof, for example, a booting state, a message state, or a charging state, and the like. The motor 1398 may convert an electric signal into mechanical vibration and may generate vibration or a haptic effect, and the like. Though not shown, the electronic device 1301 may include a processing unit (e.g., a GPU) for supporting a mobile TV. The processing unit for supporting the mobile TV may process media data according to standards, for example, a digital multimedia broadcasting (DMB) standard, a digital video broadcasting (DVB) standard, or a mediaFlo® standard, and the like.

Each of the above-mentioned elements of the electronic device according to various embodiments of the present disclosure may be configured with one or more components, and names of the corresponding elements may be changed according to the type of the electronic device. The electronic device according to various embodiments of the present disclosure may include at least one of the above-mentioned elements, some elements may be omitted from the electronic device, or other additional elements may be further included in the electronic device. Also, some of the elements of the electronic device according to various embodiments of the present disclosure may be combined with each other to form one entity, thereby making it possible to perform the functions of the corresponding elements in the same manner as before the combination.

Various embodiments of the present disclosure can provide at least one of a waterproof improving effect, a dust-proof improving effect, an insulation effect, and a support effect by arranging a bonding layer between insulation members arranged in various areas (for example, an antenna that uses a portion of a case, an ear jack area, and a USB area) used in the electronic device.

The terminology "module" used herein may mean, for example, a unit including one of hardware, software, and firmware or two or more combinations thereof. The terminology "module" may be interchangeably used with, for example, terminologies "unit", "logic", "logical block", "component", or "circuit", and the like. The "module" may be a minimum unit of an integrated component or a part thereof. The "module" may be a minimum unit performing one or more functions or a part thereof. The "module" may be mechanically or electronically implemented. For example, the "module" may include at least one of an application-specific integrated circuit (ASIC) chip, field-programmable gate arrays (FPGAs), or a programmable-logic device, which is well known or will be developed in the future, for performing certain operations.

According to various embodiments of the present disclosure, at least part of a device (e.g., modules or the functions) or a method (e.g., operations) may be implemented with, for example, instructions stored in computer-readable storage media which have a program module. When the instructions are executed by a processor, one or more processors may perform functions corresponding to the instructions. The computer-readable storage media may be, for example, a memory.

The computer-readable storage media may include a hard disc, a floppy disk, magnetic media (e.g., a magnetic tape), optical media (e.g., a compact disc read only memory (CD-ROM) and a digital versatile disc (DVD)), magneto-optical media (e.g., a floptical disk), a hardware device (e.g., a ROM, a random access memory (RAM), or a flash memory, and the like), and the like. Also, the program instructions may include not only mechanical codes compiled by a compiler but also high-level language codes which may be executed by a computer using an interpreter and the like. The above-mentioned hardware device may be configured to operate as one or more software modules to perform operations according to various embodiments of the present disclosure, and vice versa.

Modules or program modules according to various embodiments of the present disclosure may include at least one or more of the above-mentioned components, some of the above-mentioned components may be omitted, or other additional components may be further included. Operations executed by modules, program modules, or other components may be executed by a successive method, a parallel method, a repeated method, or a heuristic method. Also, some operations may be executed in a different order or may be omitted, and other operations may be added.

Embodiments of the present disclosure described and shown in the drawings are provided as examples to describe technical content and help understanding but do not limit the present disclosure. Accordingly, it should be interpreted that besides the embodiments listed herein, all modifications or modified forms derived based on the technical ideas of the present disclosure are included in the present disclosure as defined in the claims, and their equivalents.

The above-described embodiments of the present disclosure can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein.

The control unit may include a microprocessor or any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, etc. In addition, it would be recognized that when a general purpose computer accesses code for implementing the processing shown herein, the execution of the code transforms the general purpose computer into a special purpose computer for executing the processing shown herein. Any of the functions and steps provided in the Figures may be implemented in hardware, software or a combination of both and may be performed in whole or in part within the programmed instructions of a computer. No claim element herein is to be construed under the provisions of 35 U.S.C. 112, sixth paragraph, unless the element is expressly recited using the phrase "means for". In addition, an artisan understands and appreciates that a "processor" or "microprocessor" may be hardware in the claimed disclosure. Under the broadest reasonable interpretation, the appended claims are statutory subject matter in compliance with 35 U.S.C. § 101.

Although the present disclosure has been described with an exemplary embodiment, various changes and modifications may be suggested to one skilled in the art. It is intended that the present disclosure encompass such changes and modifications as fall within the scope of the appended claims.

What is claimed is:

[1. A portable terminal comprising:

a front cover disposed on a front surface of the portable terminal;

a rear part disposed on a rear surface of the portable terminal;

a side member disposed integrally with or separately from the rear part while surrounding a space defined by a distance between the front cover and the rear part;

a display device disposed in the space and comprising at least a screen area exposed through the front cover;

a communication circuit disposed in the space and electrically connected to the side member; and a processor electrically connected to the communication circuit, wherein the side member comprises:

a first elongated metallic member comprising a first metal and a first metallic surface, and electrically connected to the communication circuit to function as an antenna of the communication circuit;

a second elongated metallic member comprising the first metal and a second metallic surface and being electrically separated from the first metallic member, wherein a gap of a specific size is interposed between the first metallic member and the second metallic member;

a first polymer member filling in the gap, wherein the first polymer member comprises a first surface and a second surface opposite the first surface;

a first organic material layer inserted between the first surface of the first polymer member and the first metallic surface of the first elongated metallic member, and configured to contact the first surface of the first polymer member and the first metallic surface of the first elongated metallic member; and a second organic material layer inserted between the second surface of the first polymer member and the second metallic surface of the second metallic member and configured to contact the second surface of the first polymer member and the second metallic surface of the second metallic member, wherein the first organic material layer and the second organic material layer comprise the same material, wherein the first metallic surface of the first elongated metallic member and the second metallic surface of the second metallic member comprise recesses of at least one of repeated or random patterns, wherein the first organic material layer and the second organic material layer are formed to conform to the recesses, and wherein a roughness of a periphery of the first metallic surface of the first elongated metallic member is smaller than a roughness of a central portion of the first metallic surface of the first elongated metallic member.]

[2. The portable terminal of claim 1, wherein an average roughness (Ra) of the first metallic surface of the first metallic member is between 0.1 to 1.5μm, and an average roughness of the second metallic surface of the second metallic member is between 0.1 to 1.5μm.]

[3. An electronic device comprising:

a front cover that defines a front surface of the electronic device;

a rear part that defines a rear surface of the electronic device;

a side member that is disposed integrally with or separately from the rear part while surrounding a space defined between the front cover and the rear part;

a display device disposed in the space and comprising a screen area exposed through the front cover;

a communication circuit disposed in the space and being electrically connected to the side member that functions as an antenna of the communication circuit; and a processor electrically connected to the communication circuit, wherein the side member comprises:

at least one hole area;

a polymer member disposed on an inner wall of the hole area; and a first organic material layer inserted between one surface of the polymer member and the inner wall of the hole area, wherein one surface of the hole area comprises recesses of at least one of repeated or random patterns, wherein the organic material layer is formed to conform to the recesses, and wherein a roughness of an area of the outside of an inner wall of the hole area is smaller than a roughness of an area of the inside of the inner wall of the hole area.]

[4. The electronic device of claim 3, wherein the hole area comprises an area configured to receive an insertion of at least one of an ear jack, a USB, or a SIM card.]

[5. A case of an electronic device, the case comprising:

a body part comprising a main body and at least one auxiliary body, wherein at least a portion of the main body is a metallic portion comprising a metallic material, wherein the at least one auxiliary body includes a first auxiliary body and is disposed adjacent to the metallic portion of the main body, and wherein at least a part of the first auxiliary body is used as an antenna and configured to transmit and receive signals;

an insulation member disposed between the at least a part of the first auxiliary body and the main body; and a first bonding layer disposed between the insulation member and at least one section of the main body, and a second bonding layer disposed between the insulation member and the first auxiliary body, wherein a roughness of a periphery of a surface of the main body is smaller than a roughness of a central portion of the surface of the main body.]

[6. The case of claim 5, wherein at least one of the surface of the main body, which faces the insulation member, or a surface of the first auxiliary body, which faces the insulation member, comprises:

a maximum roughness (Rz) between 0.01 to 3μm, or an average roughness (Ra) between 0.01 to 1.5 μm.]

[7. The case of claim 5, wherein a roughness of a periphery of a surface of the first auxiliary body, which faces the insulation member, is different from a roughness of a central portion of the surface of the first auxiliary body.]

[8. The case of claim 7, wherein the roughness of the periphery of the surface of the first auxiliary body is smaller than the roughness of the central portion of the surface of the first auxiliary body.]

[9. The case of claim 5, wherein the insulation member comprises a polymer resin comprising at least one of poly phenylene sulfide (PPS), poly butylene terephthalate (PBT), polyimide (PI), or polycarbonate (PC).]

[10. The case of claim 5, wherein the insulation member is formed of a polymer resin comprising inorganic particles.]

[11. The case of claim 5, wherein the insulation member has a thickness of 0.5 to 2.5 mm.]

[12. The case of claim 5, wherein at least one of the first bonding layer and the second bonding layer comprises an organic bonding layer including at least one of triazine thiol, dibutyl amino, dithio pirymidine, or a silane-based composition.]

[13. The case of claim 5, wherein at least one of the first bonding layer and the second bonding layer has a thickness of 0.1 to 3μm.]

[14. The case of claim 5, wherein at least one of the first bonding layer and the second bonding layer is disposed in an area of a side periphery of the main body.]

[15. The case of claim 5, wherein at least one of the first bonding layer and the second bonding layer is disposed in a transverse end area of the first auxiliary body that is longer transversely than longitudinally.]

[16. The case of claim 5, wherein at least one of the first bonding layer and the second bonding layer is disposed in all parts of surfaces of the main body facing the first auxiliary body.]

[17. An electronic device comprising:

a body part comprising a main body and at least one auxiliary body, wherein at least a portion of the main body is a metallic portion comprising a metallic material, wherein the at least one auxiliary body includes a first auxiliary body and is disposed adjacent to the metallic portion of the main body, and wherein at least a part of the first auxiliary body is used as an antenna and configured to transmit and receive signals;

an insulation member disposed between the at least a part of the first auxiliary body and the main body;

a first bonding layer disposed between the insulation member and at least one section of the main body, a second bonding layer disposed between the insulation member and the first auxiliary body;

a communication circuit electrically connected to the antenna; and a printed circuit board on which the communication circuit is mounted, wherein a roughness of a periphery of a surface of the main body is smaller than a roughness of a central portion of the surface of the main body.]

[18. The electronic device of claim 17, further comprising:

a front part disposed on a front surface of the main body; and a rear part disposed on a rear surface of the main body, wherein the first auxiliary body is disposed between the front part and the rear part and at least a portion of the first auxiliary body is exposed to the outside, wherein the first bonding layer is disposed between an exposed area of the main body and the insulation member, and wherein the second bonding layer is disposed between an exposed area of the first auxiliary body and the insulation member.]

*19. An electronic device, comprising:*

*a front cover that defines a front surface of the electronic device;*

*a rear part that defines a rear surface of the electronic device;*

*a side member that is disposed integrally with or seperately from the rear part while surrounding a space*

*defined between the front cover and the rear part, the side member forming a side surface of the electronic device;*

*a display device disposed in the space and comprising a screen area exposed through the front cover;*

*a communication circuit disposed in the space; and*

*a processor electrically connected to the communication circuit,*

*wherein the side member comprises:*

*at least one hole area including a metallic curved inner surface,*

*a first bonding layer disposed on the metallic curved inner surface, the first bonding layer including an organic material and an oxidation layer of a material of the metallic curved inner surface,*

*a first insulation member disposed on the first bonding layer such that a substantial portion of the hole area remains open,*

*a first metallic portion composed of a metallic material and forming a part of the side surface,*

*a second metallic portion composed of the metallic material and forming another part of the side surface and spaced apart from the first metallic portion by a first gap extended in substantially entire height of the side member between the front surface and the rear surface, and*

*a second insulation member disposed between the first metallic portion and the second metallic portion and located in the first gap as extended between the front surface and the rear surface, and*

*wherein the first insulation member and the second insulation member are formed as part of a same insulation member.*

*20. The electronic device of claim 19, wherein the hole area comprises an area configured to receive an insertion of at least one of an ear jack, a USB, or a SIM card.*

*21. A portable electronic device, comprising:*

*a front cover;*

*a rear cover;*

*a side portion forming a side surface of the portable electronic device;*

*a display visually exposed through the front cover; and*

*a processor operatively coupled with the display;*

*wherein the side portion includes:*

*a hole area forming a through-hole passing through the side portion, the through-hole having a metallic curved inner surface;*

*a first bonding layer disposed on the metallic curved inner surface, the first bonding layer including an organic material and an oxidation layer of a material of the metallic curved inner surface; and*

*a first insulation member disposed on the first bonding layer such that a substantial portion of the hole area remains open.*

*22. The portable electronic device of claim 21, wherein the hole area and a second insulation member are formed on a same side of the side portion.*

*23. The portable electronic device of claim 21, wherein the side portion comprises a first side portion formed of a metallic material that forms at least a portion of a side exterior surface of the portable electronic device and a second side portion formed of a metallic material that forms at least a portion of another side exterior surface of the portable electronic device, and*

*wherein the hole area is formed on the first side portion.*

*24. The portable electronic device of claim 21, wherein the first insulation member forms a closed loop along a periphery part of the through-hole.*

*25. The portable electronic device of claim 21, wherein a thickness of the first insulation member is between 0.5 mm and 2.5 mm.*

*26. The portable electronic device of claim 21, wherein a thickness of the first bonding layer is between 0.1 μm and 3 μm.*

*27. The portable electronic device of claim 21, wherein the metallic curved inner surface includes at least one of aluminum or an aluminum-magnesium or aluminum-zinc-magnesium alloy.*

*28. The portable electronic device of claim 21, wherein the organic material includes at least one of triazine thiol, dibutyl amino, dithio pirymidine, or a silane-based composition.*

*29. The portable electronic device of preceding claim 21, wherein the through-hole is formed to accommodate at least a portion of a USB connector.*

*30. The portable electronic device of claim 21, wherein a roughness of the metallic curved inner surface is smaller than a roughness of an area of the side portion that is covered by the display.*

*31. The portable electronic device of claim 21, wherein a roughness of a portion of the side portion that is covered by the front cover is different from a roughness of a portion of the side portion that is exposed.*

*32. The portable electronic device of claim 21, wherein a roughness of a periphery of a surface of the side portion, which faces the first insulation member, is different from a roughness of a central portion of a surface of the side portion, which faces the first insulation member.*

*33. The portable electronic device of claim 32, wherein the roughness of the periphery of the surface of the side portion is smaller than the roughness of the central portion of the surface of the side portion.*

* * * * *